(12) United States Patent
Wolterink et al.

(10) Patent No.: US 8,757,060 B2
(45) Date of Patent: Jun. 24, 2014

(54) METHOD AND APPARATUS FOR LOADING AND UNLOADING FLEXOGRAPHIC PLATES FOR COMPUTER-TO-PLATE IMAGING INCLUDING SEPARATE LOADING AND UNLOADING AREAS

(71) Applicant: Esko-Graphics Imaging GmbH, Itzehoe (DE)

(72) Inventors: Jörg Wolterink, Oelixdorf (DE); Jörg Koberg, Itzehoe (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 0 days.

(21) Appl. No.: 13/975,091

(22) Filed: Aug. 23, 2013

(65) Prior Publication Data

US 2013/0340637 A1 Dec. 26, 2013

Related U.S. Application Data

(62) Division of application No. 12/112,886, filed on Apr. 30, 2008, now Pat. No. 8,516,961.

(51) Int. Cl.
*B41C 3/08* (2006.01)
*B41F 27/12* (2006.01)

(52) U.S. Cl.
USPC .................... 101/401.1; 101/474; 101/477

(58) Field of Classification Search
USPC ......... 101/382.1, 383, 401.1, 415.1, 474, 477
See application file for complete search history.

(56) References Cited

U.S. PATENT DOCUMENTS

| 4,070,110 | A | * | 1/1978 | Ott | 355/100 |
|---|---|---|---|---|---|
| 5,386,268 | A | | 1/1995 | Ohlig et al. | |
| 5,455,416 | A | | 10/1995 | Zertani et al. | |
| 5,992,324 | A | | 11/1999 | Rombult et al. | |
| 6,189,452 | B1 | * | 2/2001 | Halup et al. | 101/415.1 |
| 7,000,543 | B2 | | 2/2006 | Klein et al. | |
| 2005/0011382 | A1 | | 1/2005 | Donahue et al. | |
| 2005/0183597 | A1 | * | 8/2005 | Hull et al. | 101/401.1 |
| 2005/0266358 | A1 | * | 12/2005 | Roberts et al. | 430/394 |
| 2006/0054040 | A1 | | 3/2006 | Daems et al. | |
| 2008/0280227 | A1 | | 11/2008 | Sievers | |

FOREIGN PATENT DOCUMENTS

EP 1 579 987 9/2005

OTHER PUBLICATIONS

PCT Search Report for PCT Application No. PCT/IB2008/001901.
Official Communication from the European Patent Office Examining Division for Application 08788907.7 mailed Feb. 21, 2011.

* cited by examiner

*Primary Examiner* — Ren Yan
(74) *Attorney, Agent, or Firm* — Dov Rosenfeld; Inventek

(57) ABSTRACT

An apparatus for and a method of loading and unloading of plates to and from an imager. The apparatus includes a loading area holding one single or a plurality of plates and an unloading area holding a single plate, the areas arranged vertically. The plate includes ultraviolet curable material. The apparatus includes a control system configured when in operation to control the automated loading and unloading and the apparatus elements therefor. One fully automatic version includes automatic loading from a stack or set of plate magazines and in the case that the plate includes a protective sheet thereon, includes removing the protective sheet from the plate. Some versions also include one or more ultraviolet sources to irradiate the flexographic plates with ultraviolet radiation during the automated loading and/or unloading. The ultraviolet sources are controlled by the same control system.

20 Claims, 42 Drawing Sheets

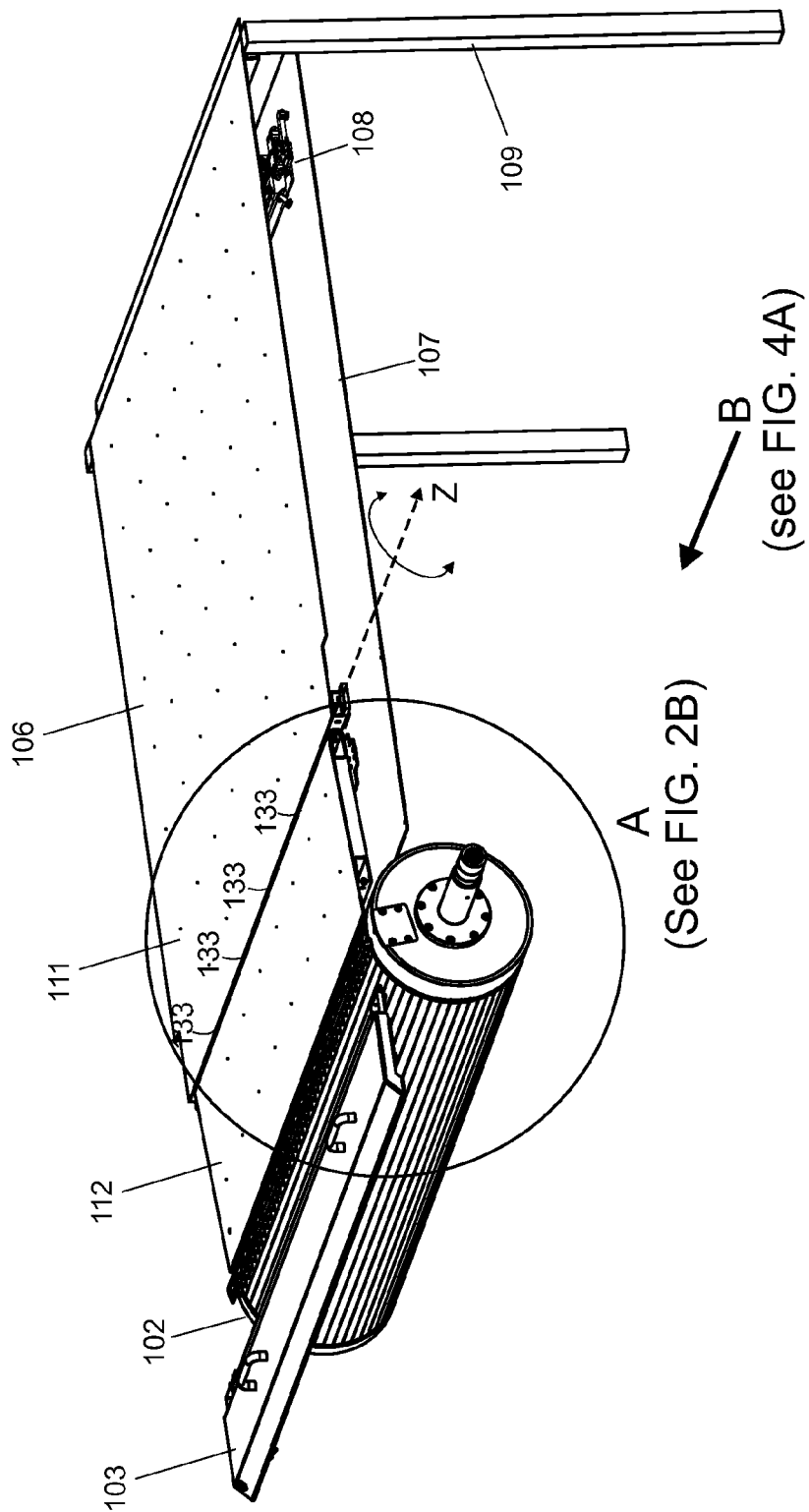

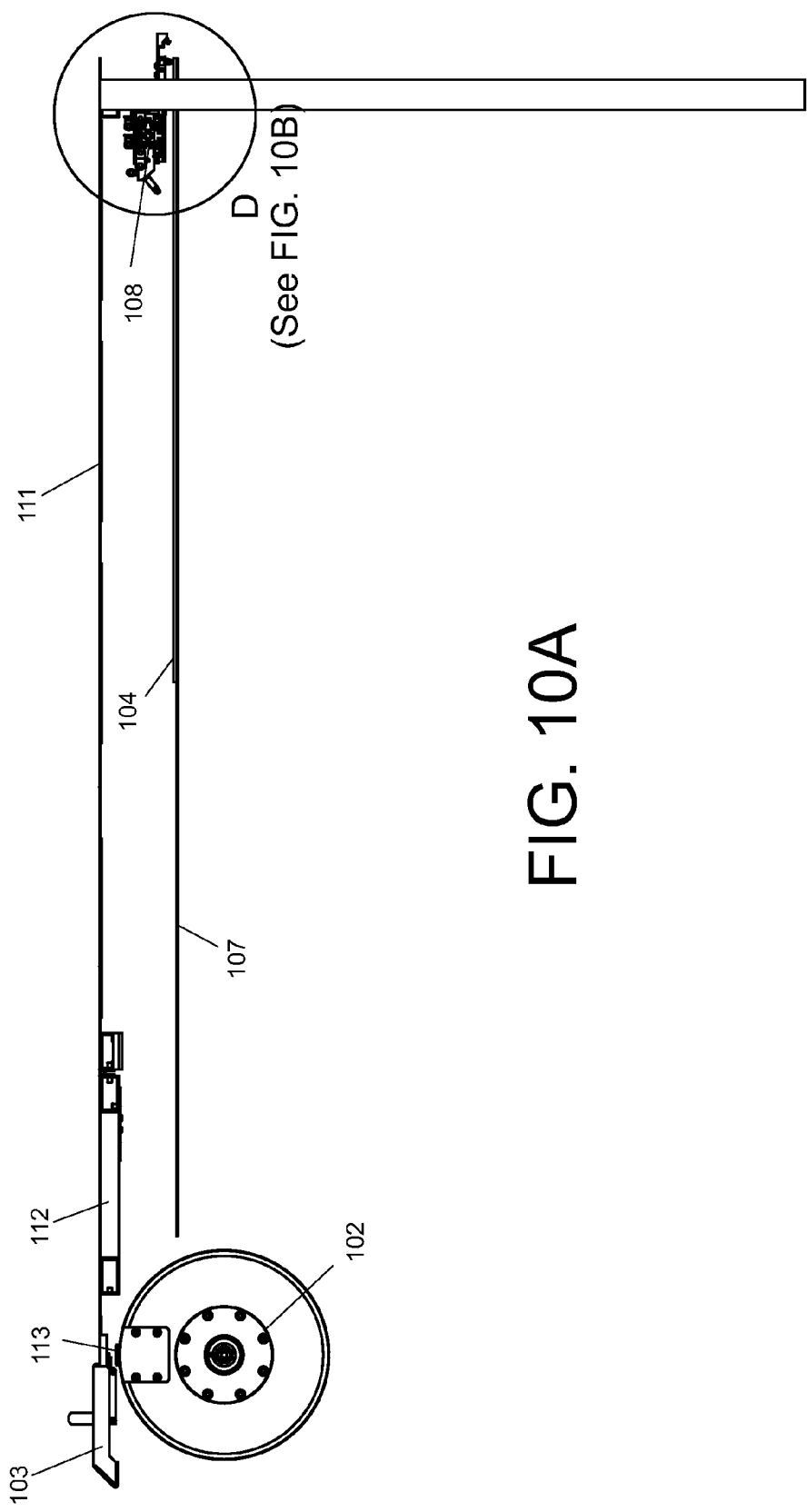

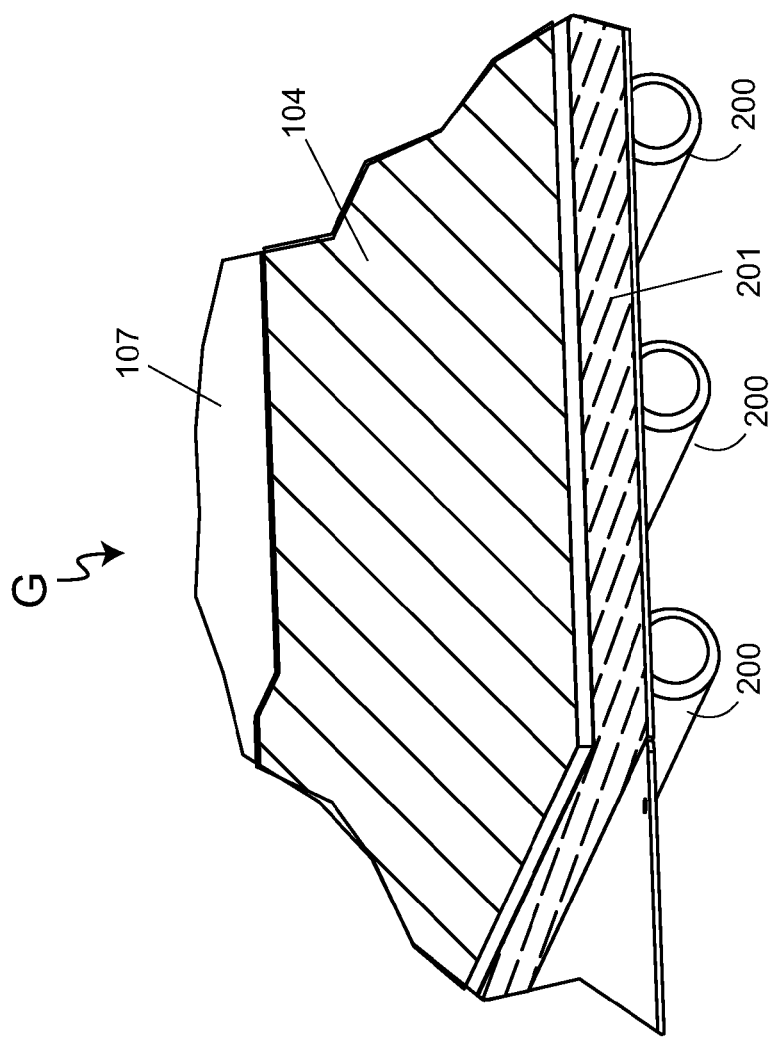

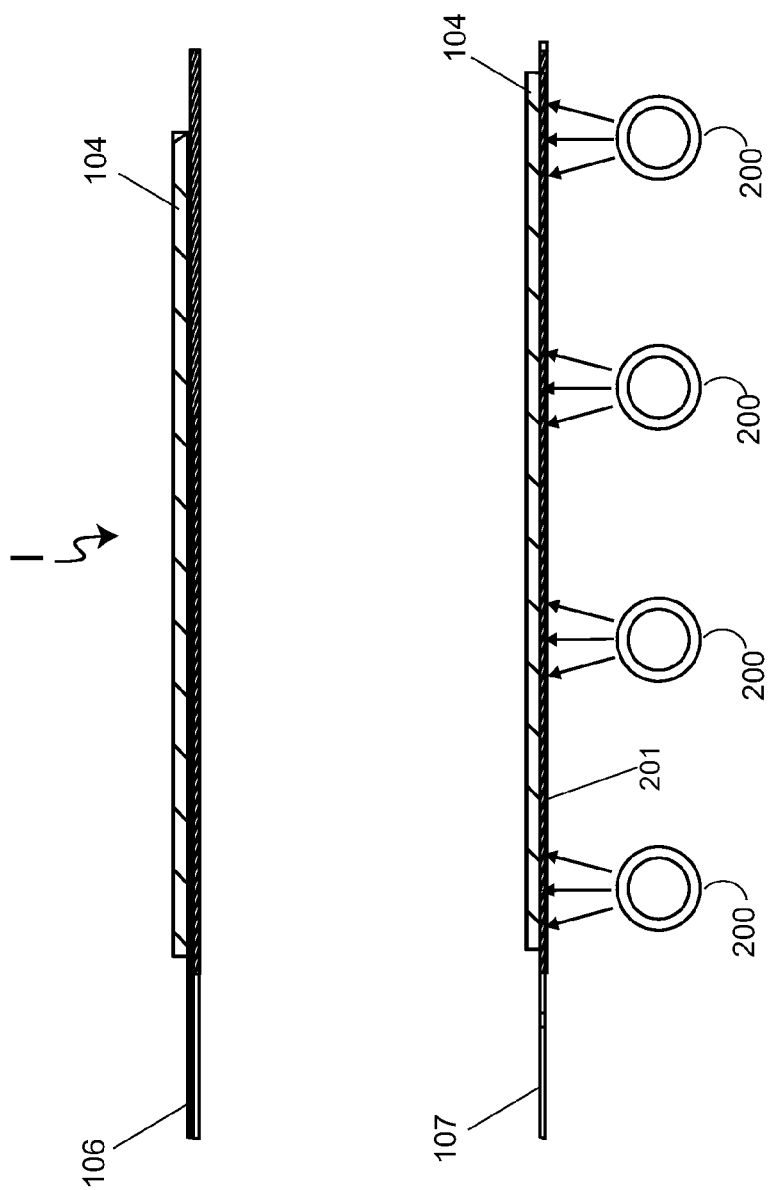

METHOD AND APPARATUS FOR LOADING AND UNLOADING FLEXOGRAPHIC PLATES FOR COMPUTER-TO-PLATE IMAGING INCLUDING SEPARATE LOADING AND UNLOADING AREAS

RELATED APPLICATION

The present invention is a division of U.S. patent application Ser. No. 12/112,886, filed Apr. 30, 2008 to inventors Wolterink, et al., now U.S. Pat. No. 8,516,961. U.S. patent application Ser. No. 12/112,886 claims priority of and is a conversion to ordinary application of U.S. Provisional Patent Application No. 60/916,738 filed May 8, 2007 to inventors Wolterink, et al. The contents of each of U.S. application Ser. Nos. 12/112,886 and 60/916,738 are incorporated herein by reference.

FIELD OF THE INVENTION

The present disclosure relates generally to printing, and specifically to a method and an apparatus to aid the loading and unloading of flexographic plates to and from an imager.

BACKGROUND

Flexographic plates designed for computer-to-plate (CTP) imaging are typically photopolymer plates that are pre-sensitized with a coating such as a Laser Ablation Mask System (LAMS) coating that is ablated by a laser in an imager during imaging. The LAMS layer is typically highly sensitive and vulnerable before and after imaging, so that scratches may destroy the flexographic plate and make it unusable.

It is known and the inventors have found that exposing a so-imaged plate with ultraviolet irradiation significantly reduces the hazard of damaging the flexographic plate, e.g., by scratching the plate. The inventors also have found that alternatively so irradiating a plate with UV radiation prior to imaging also significantly reduces the hazard of damaging the flexographic plate, e.g., by scratching the plate.

There is thus an incentive to reduce the amount of handling to automate the process of loading and unloading.

There also is an incentive to reduce the amount of time to load and unload a set of plates.

There also is an incentive to integrate irradiating plates with the process(es) of loading and/or unloading.

SUMMARY

Embodiments of the present invention include a method and an apparatus to aid the loading and unloading of flexographic plates to and from an imager. The apparatus includes a loading area holding one single or a plurality of flexographic plates and an unloading area holding a single flexographic plate, the areas arranged vertically, and a control system to control the automated loading and unloading mechanism. In one version, the loading includes automatically loading a plate onto the loading area, and in the case that the plate includes a protective sheet thereon, the automatic loading to the loading area includes removing the protective sheet from the plate. One embodiment of the apparatus also includes one or more sources of ultraviolet (UV) energy configured to irradiate flexographic plates with ultraviolet radiation at some time or times during the process that includes loading and unloading, and controlled by a control system. One arrangement includes UV radiating prior to the plates being imaged, and another arrangement includes UV radiating after the imaging, and yet a third embodiment includes UV radiation of the underside of the plate prior to imaging, and UV radiating the top side after imaging.

Particular embodiments include an apparatus for loading printing plates comprising a frame, an imager configured for imaging a plate, a loading area configured to hold at least one plate that is to be loaded on to the imager, the holding of a to-be-loaded plate being at a loading position, and an unloading area separate from the loading area. The apparatus further comprises a control system configure to control the loading of a particular plate from the loading position on to the imager, the imaging of the loaded plate to form an imaged plate, and the unloading of the imaged plate onto the unloading area. The apparatus is configured such that while one plate is positioned at the loading position on the loading area, another plate can be unloaded from the imager or be situated at the unloading area.

In some embodiments, the loading and unloading areas are arranged in a manner that enables a first plate to be on the loading area while another plate is simultaneously at the unloading area. For example, in one embodiment, the imager is a drum imager includes a rotatable drum, each of the loading area and unloading area are approximately horizontal, and the loading and unloading areas are arranged vertically to each other.

In some embodiment, the apparatus further comprises one or more sources of ultraviolet energy configured to irradiate a plate with ultraviolet radiation at one or more intervals of time during the process that includes loading and unloading the plate, such that a plate that includes material that is curable by irradiation with ultraviolet radiation can be cured by one or more of the sources of ultraviolet energy.

Particular embodiments include a method comprising loading a printing plate from a loading area on to an imager. The printing plate includes material that is curable by irradiation with ultraviolet radiation. The method further includes imaging the loaded printing plate, and unloading the printing plate from the imager. The method further comprises automatically irradiating the printing plate by ultraviolet radiation prior to or after the imaging.

Particular embodiments include an apparatus for making printing plates comprising means for loading a printing plate from a loading area on to an imager. The printing plate includes material that is curable by irradiation with ultraviolet radiation. The apparatus further includes means for imaging the loaded printing plate; means unloading the printing plate from the imager; and means for automatically irradiating the printing plate by ultraviolet radiation prior to or after the imaging. In some embodiments, the apparatus further comprising a loading area and an unloading area. The loading and unloading areas are arranged in a manner that enables a first plate to be on the loading area while another plate is simultaneously at the unloading area. In some embodiments, the loading area and the unloading area are arranged one above the other, and the apparatus further comprises at least one ultraviolet source arranged under the loading area and at least one ultraviolet source arranged under the unloading area.

Particular embodiments include a printing plate that has material that is curable by irradiation with ultraviolet radiation and that is obtained according to a method for making printing plates comprising the steps of: loading a printing plate from a loading area on to an imager; imaging the loaded printing plate; and unloading the printing plate from the imager. The method further comprising automatically irradiating the printing plate by ultraviolet radiation prior to or after the imaging.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

BRIEF DESCRIPTION OF THE DRAWINGS

FIG. 2A shows the system of FIG. 1 in simplified form according to an embodiment of the present invention.

FIG. 10A shows an end view of an embodiment of the system with a plate in the unloaded position after automated unloading.

FIG. 11B shows the region denoted by G in FIG. 11A magnified.

FIG. 12B shows the area marked I in FIG. 12A magnified.

DESCRIPTION OF EXAMPLE EMBODIMENTS

Figure 1:
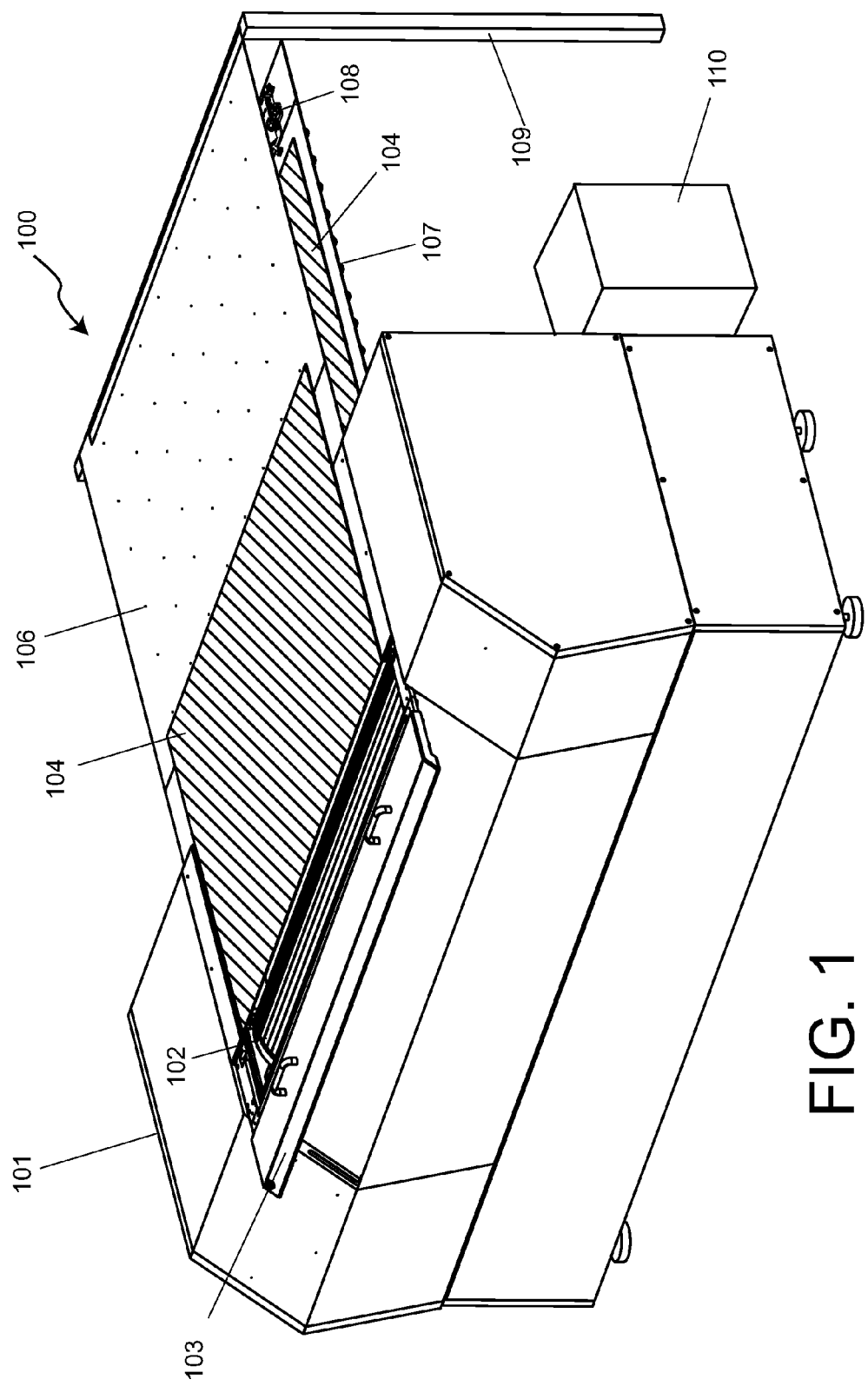
FIG. 1 shows one embodiment of a system that includes an external drum imager for flexographic plates or photopolymer letterpress plates, and a loader that includes a loading area and an unloading area each for holding a single plate.

The present invention describes an apparatus, method, and system for automated plate loading, imaging and unloading of plates that have ultraviolet curable material, and further a process step that includes ultraviolet irradiation of the plates.

The description herein will be for flexographic plates that typically are made of ultraviolet curable polymer material. The invention is however applicable to any type of plate that has material that is curable by ultraviolet energy. Examples include flexographic plates and letterpress plates that include photopolymer material.

One feature of the invention is including two separate areas, one for loading a plate and one for unloading a plate. Having such separate areas means that during imaging of a flexographic plate on the imager, in some embodiments, the next plate for loading onto the drum can be prepared including moving onto the loading area, and in some embodiments, irradiating the underside of the plate. Furthermore, in some embodiments, at the same time, the previously imaged plate that was unloaded from the drum can be in the middle of being unloaded, and/or in some embodiments, be irradiated with ultraviolet radiation. In some embodiments, one or more of (a) the preparing for loading, including moving onto the loading area, the (b) continuing with the unloading, and/or the irradiating can occur while (c) the next plate is imaged by the imager. Such a pipelined system reduces the extensive downtime that occurs by loading, unloading, irradiating and imaging using an imager.

Flexographic plates designed for CTP imaging are typically photopolymer plates that are pre-sensitized with a coating such as a Laser Ablation Mask System (LAMS) coating that is ablated by a laser in an imager during imaging. The LAMS layer is typically highly sensitive and vulnerable before and after imaging, so that scratches may destroy the flexographic plate and make it unusable. It is known and the inventors have found that exposing a so-imaged plate with ultraviolet irradiation significantly reduces the hazard of damaging the flexographic plate, e.g., by scratching the plate. The inventors also have found that alternatively so irradiating a plate with UV radiation prior to imaging also significantly reduces the hazard of damaging the flexographic plate, e.g., by scratching the plate.

Some embodiments of the present invention include integrating an ultraviolet source subsystem including one or more ultraviolet sources with the loading and unloading, the ultraviolet source subsystems configured to expose the flexographic plate to ultraviolet radiation on one side, or another side, or both sides of the plate. By so integrating the irradiating with the loading and unloading into an automated process such that the vulnerability of plates to damage by manual operation is reduced.

Another feature of some embodiments of the invention is reducing the process time for flexographic plate making by having a pipeline that carries out more than one operation on more than one plate at the same time.

Embodiments of the invention further include automated loading of the plate onto the loading area, automated loading from the loading area onto the drum, and automated unloading of the plates to reduce the need to handle the plates by an operator.

One embodiment of the invention includes a semi-automated loader of a plate. In the case of a semi-automated arrangement, an operator manually loads and positions a plate on the loader at a loading position on the loading area. In the case that a protective sheet is included on the plate, the operator also removes the protective sheet. The remainder of the process: loading the plate onto the imager from the loading position, imaging the plate on the imager according to imaging data, and unloading of the plate is carried out automatically under control of a control system. In the case ultraviolet irradiation is includes, such irradiating also is automatic under control of the control system.

Another embodiment of the invention includes a fully automated loader. In the case of such an automated arrangement, a mechanism picks up a plate, e.g., from a stack of plates or on another embodiment, from a compartment of a magazine of plate compartments, places the picked up plate to a loading position on the loading area, in the case that a protective sheet is included on the plate, removes the protective sheet. The remainder of the process is basically the same as in the semi-automated loader embodiment: the loading of the plate onto the imager from the loading position, imaging the plate on the imager according to imaging data, and unloading of the plate is also carried out automatically.

Some semi-automatic loading embodiments and some fully automatic loading embodiments, include one or more UV irradiation subsystems integrated and configured to expose the plate to UV radiation in a fully automatic manner under control of the control system. The irradiation in one set of embodiments is of to-be-imaged plates, and occurs, e.g., during loading. The irradiation in another set of embodiments is of an imaged plate, and occurs, e.g., during unloading. The irradiation in another set of embodiments occurs, during loading and unloading.

FIG. 1 shows one embodiment of a system 100 that includes an external drum imager 101 for flexographic plates (or photopolymer letterpress plates) and a novel loader that includes a loading area and an unloading area each for holding a single plate. The loading area and the unloading area are each approximately horizontal and arranged vertically to each other. In the example embodiment described herein, the unloading area is under the loading area. Those in the art will understand that "approximately horizontal" in this context means that any tilt from horizontal is such that a plate placed on the loading or unloading are will not simply slide away.

One embodiment of the imager 101 includes a rotatable drum 102 for loading a flexographic plate 104 thereon. A door mechanism 103 provides access to the drum for loading and unloading and is closed during imaging. In order to show the drum in FIG. 1, the door mechanism 103 is shown in its open position. The imager 101 includes at least one laser source that provides one or more laser beams modulated by imaging data, e.g., sets of data for each of a plurality of color separations for exposing the respective plates for a color print. Each laser is configured for exposing CTP flexographic plates, e.g., has the appropriate energy and wavelength for exposing the particular type of coating, e.g., type of LAMS coating on the flexographic plates. An example of one such flexographic imager 101 is the Esko-Graphics Cyrel™ Digital Imager (Esko-Graphics, Gent, Belgium) made by Esko-Graphics, the assignee of the present invention.

In order not to obscure the inventive aspects, the novel loader is shown in FIG. 1 in simplified form.

In one embodiment, the novel loader includes a frame 109, a horizontal loading area 106 and a horizontal unloading area 107, each of the loading and unloading area designed for holding a single flexographic plate. One feature of the invention is that the loading and unloading areas are separate so that while one plate is positioned at the loading position on the loading area 106, another plate can be unloaded or situated at the unloading area 107. In the embodiment shown, the unloading area 107 is arranged vertically beneath the loading area 106. FIG. 1 shows a plate 104 on the loading area 106 and another plate in the unloading area 107.

One feature of an embodiment of the invention is the automatic loading of a plate onto the drum from the loading area 106, and another feature is the automatic unloading of a plate, e.g., an imaged plate from the drum onto the unloading area 107. Another feature of some embodiments is the automatic positioning of single plate from a stack of plates or a magazine of compartments of plates onto the loading area 106 and automatic removal of any protective coversheet from the top of the plate during positioning onto the loading area 106 or during loading onto the drum.

Another feature of an embodiment of the invention is the automatic exposure of the plate to light, e.g., to UV-radiation, in one version during positioning onto the loading area 106, in other embodiments, during loading onto the drum or during unloading onto the unloading area or when lying on the unloading area, or during more than one of these phases. The loading, unloading, automatic positioning when included and UV features are controlled under control of the control system 110.

The edge of the plate parallel to the drum axis and closest to the imager when the plate is in the horizontal position is called the front edge, and that furthest from the imager is called the rear edge.

Figure 2B:
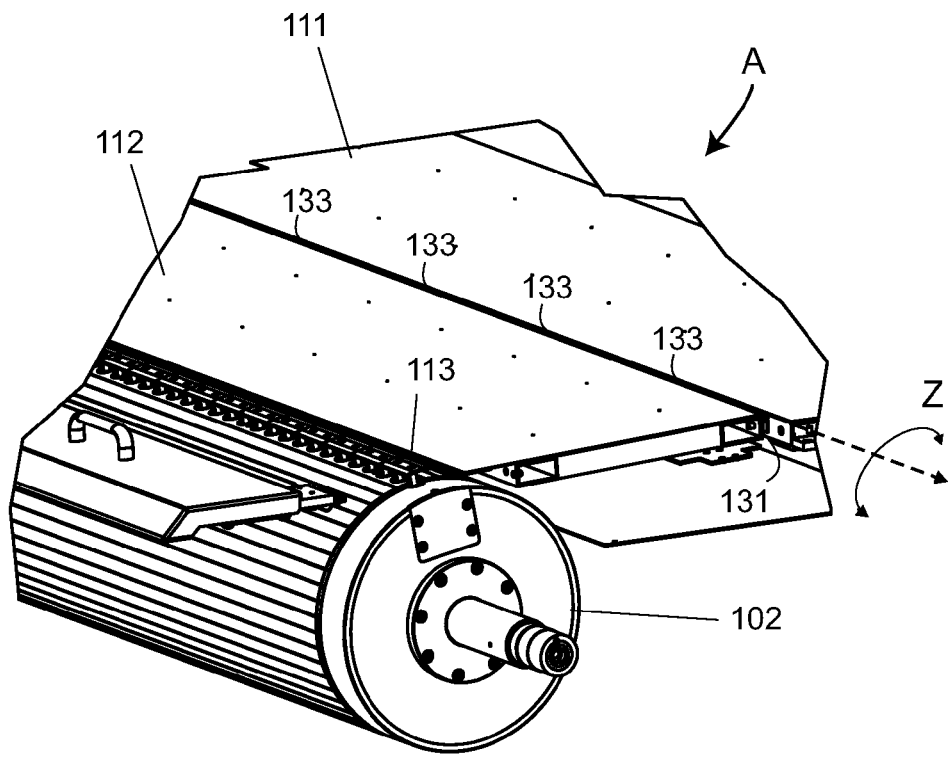
FIG. 2B shows the region marked A in FIG. 2A in magnified form.

FIG. 2A shows the system in simplified form, and FIG. 2B shows the region marked A in magnified form. These drawings show the imager is reduced to the drum 102 that includes an automated clamp 113, e.g., a T-shaped clamp as described in U.S. Pat. No. 7,165,492 to Koberg, et al. titled METHOD AND APPARATUS TO CLAMP AND RELEASE FLEXIBLE PLATES ONTO AN IMAGING CYLINDER. The loading area 106 includes two parts: a front loading part 112 which is closest to the drum and a rear loading part 111 which is horizontally arranged on the rear side opposite to the one closest to the drum. In one embodiment, the front loading part 112 is hingeably connected by a hinge mechanism 131 to the rear loading part 111 and can be tilted along the front part's rear edge 133 to rotate about an axis shown as Z. Tilting downwards causes its front edge to be lowered towards the surface of drum. By the front loading part 112 being closed is meant the front loading part 112 co-planar with the rear loading part 106. The front loading part 111 is so closed during imaging, and, as described below, can be tilted at the hinge edge 133 so that the front edge of a plate thereon is moved towards the drum surface as part of loading. The front and rear loading parts 112 and 111 together form the loading area 106.

Figure 3A:
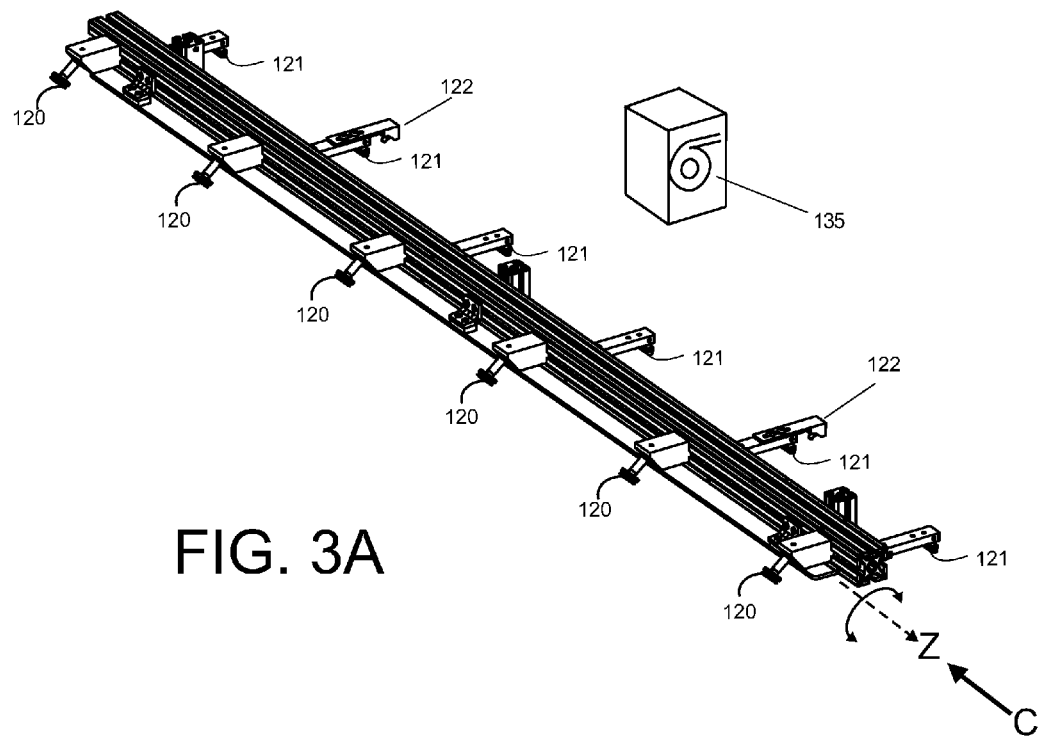
FIG. 3A shows a perspective view of an embodiment of a grabber mechanism included in an embodiment of the system.
Figure 3B:
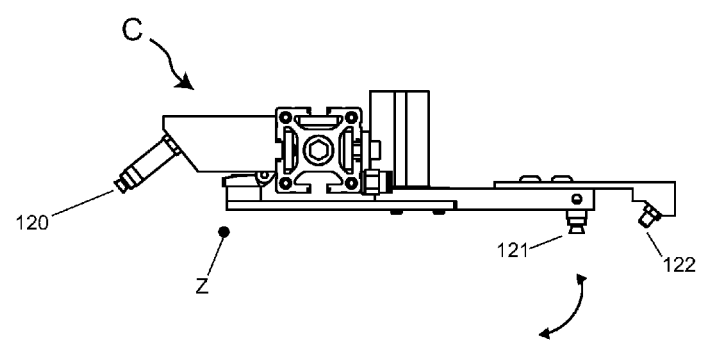
FIG. 3B shows an end view labeled C in FIG. 3A of the grabber mechanism embodiment shown in FIG. 3A.

The system further includes a grabber mechanism 108. FIG. 3A shows a perspective view and FIG. 3B an end view labeled C of the grabber mechanism 108 that includes a first set of vacuum cups (also called suction cups) 120 arranged in the front (drum) side, a second set of vacuum cups (also called suction cups) 121 arranged in the rear side (away from the drum), and a set of air injectors 122 also arranged in the rear side. There is a supply of vacuum 135 that is controllable by the control system 110 to turn on or off vacuum to the first set of vacuum cups 120 closest to the imager, and to turn on or off vacuum to the second rear set of vacuum cups 121 under control of the control system 110. The same supply 135 also is used in one embodiment to turn on or off a supply of air to the rear air injectors 122, again under control of the control system 110. The supply 135 is shown in symbolic form in FIG. 3A. Furthermore, those in the art will understand that there are valves and supply hoses included for such function, and such details are not shown in the drawings in order not to obscure the inventive aspects of the example embodiment. The grabber mechanism of FIGS. 3A and 3B is movable under control of the control system 110 in the horizontal direction. The direction towards the drum, towards which the first set of vacuum cups 120 point is called front direction and the direction away from the drum is called rear direction. Also the rear vacuum cups 121 and the rear air injectors 122 are hinged to the grabber mechanism and can be tilted along the axis labeled Z in FIG. 3A, under control of the control system 110.

Figure 4A:
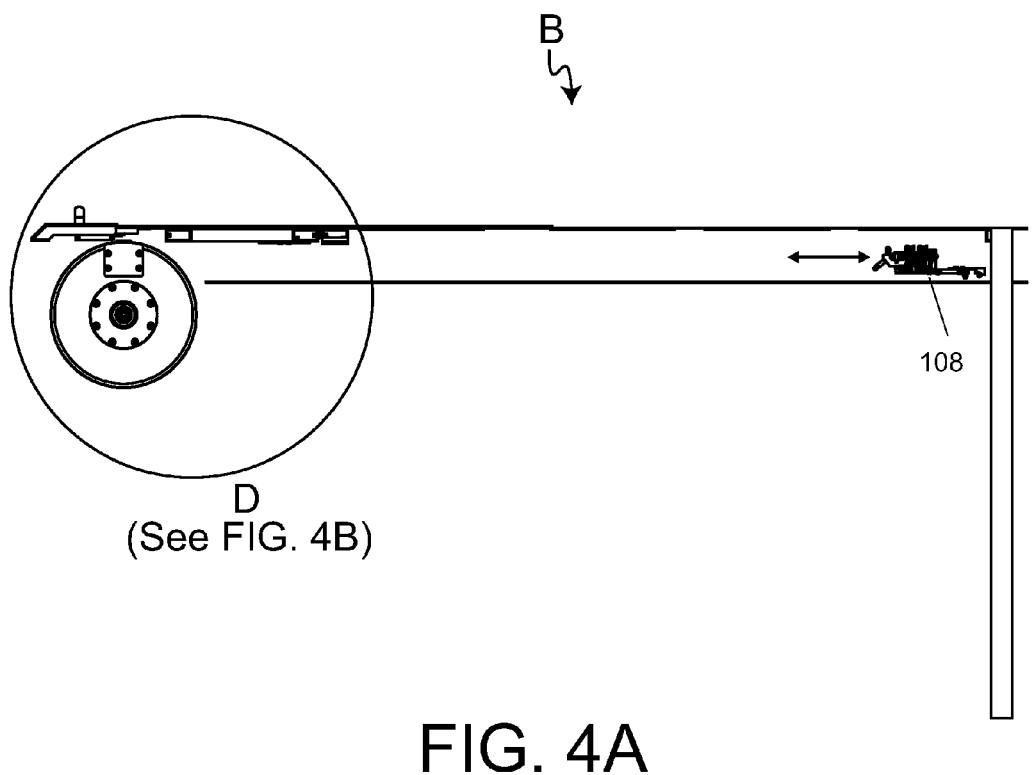
FIG. 4A shows a side view of an embodiment of the system in simplified form in which the imager is represented only by the drum.
Figure 4B:
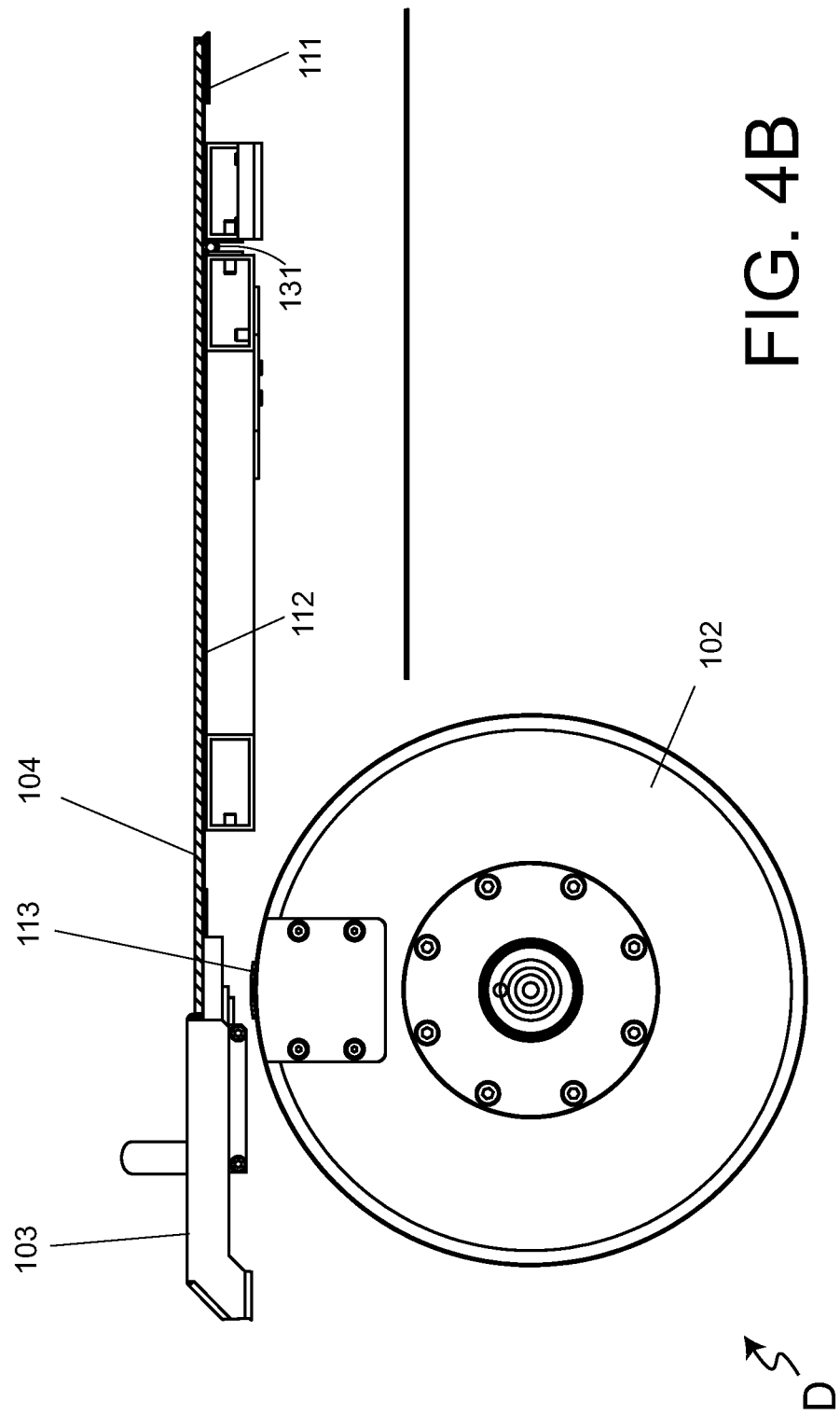
FIG. 4B shows a magnified view of the region labeled D in FIG. 4A.
Figure 5:
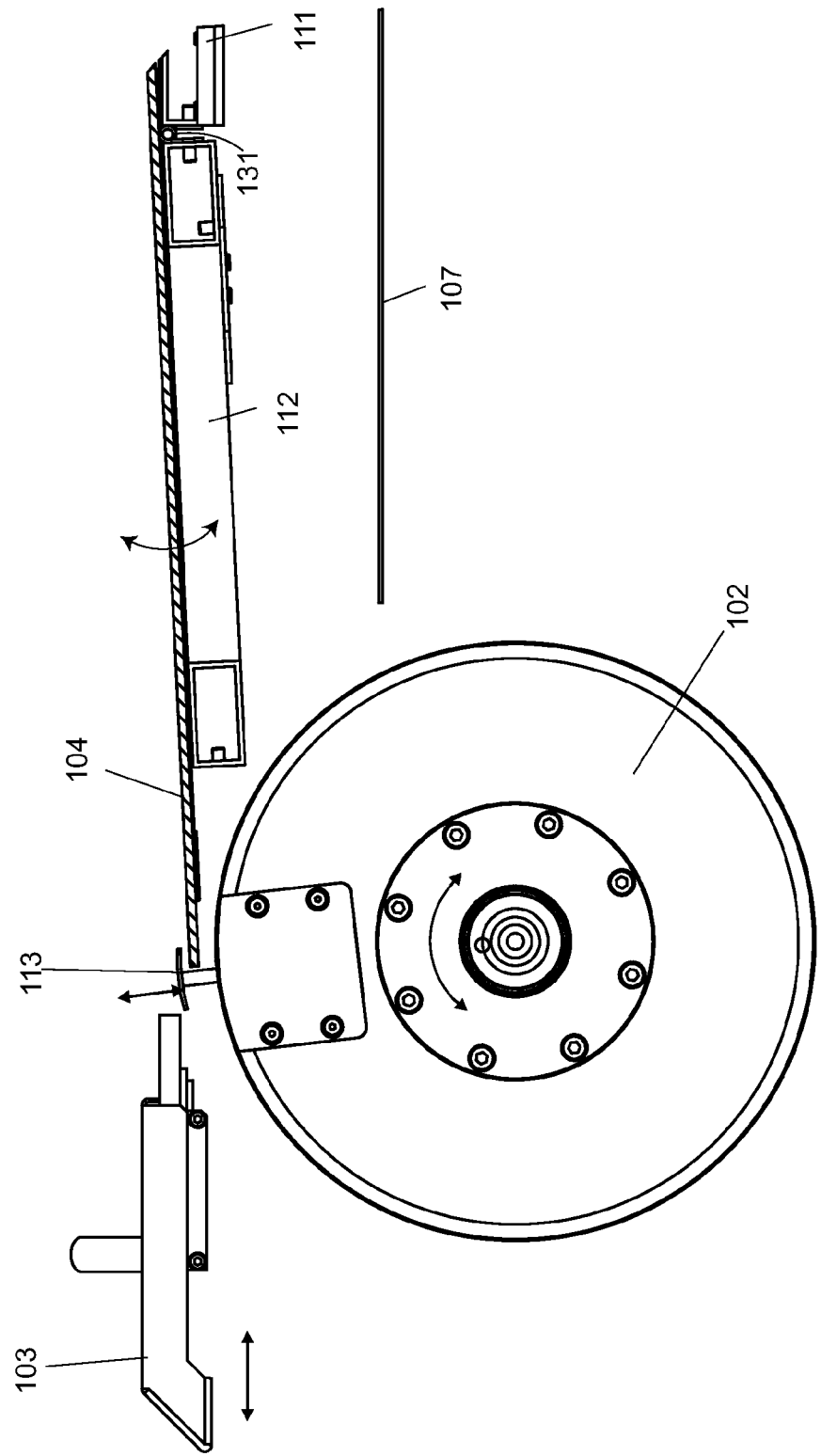
FIG. 5 shows a side view of an embodiment of the imager with the front edge of a plate in the gap between the clamp and the outer surface of the drum.

FIG. 4A shows a side view of the system 100 in simplified form in which the imager is represented only by the drum. FIG. 4B shows a magnified view of the region labeled D. The door mechanism 103 and the front loading part 112 are shown in the in closed position in which the front loading part is co-planar with the rear loading part to form the loading area 106. A plate 104 is shown thereon. The drum 102 is shown after being moved under control of the control system 110 to a loading position wherein the automated clamp 113 is in an upright position and is closed. The loading position is configured so that when the clamp 113 is opened, e.g., raised relative to the drum surface to form a gap between the clamp and the drum surface, the front edge of a plate can be moved into the gap region between the clamp and the drum surface. When a plate 104 with any protective coversheet removed is positioned in a plate loading position such that the front edge of the plate 104 is positioned directly against the edge of the door mechanism 103, the control system in operation causes the door mechanism 103 to move to an open position and causes the front loading part 112 to tilt down by counterclockwise rotation in the views shown, with the plate 104 and its front edge thereon. The control system in operation causes the automated clamp 113 to open and the drum is positioned so that one side of the clamp 113 is directly over the front edge of plate 104, i.e., the front edge of the plate is in the gap between the clamp 113 and the drum surface. FIG. 5 shows a side view of the imager with the front edge of the plate 104 in the gap between the clamp 113 and the outer surface of the drum 102 so that closing the clamp 113 would clamp the front edge of the plate onto the drum.

Figure 6:
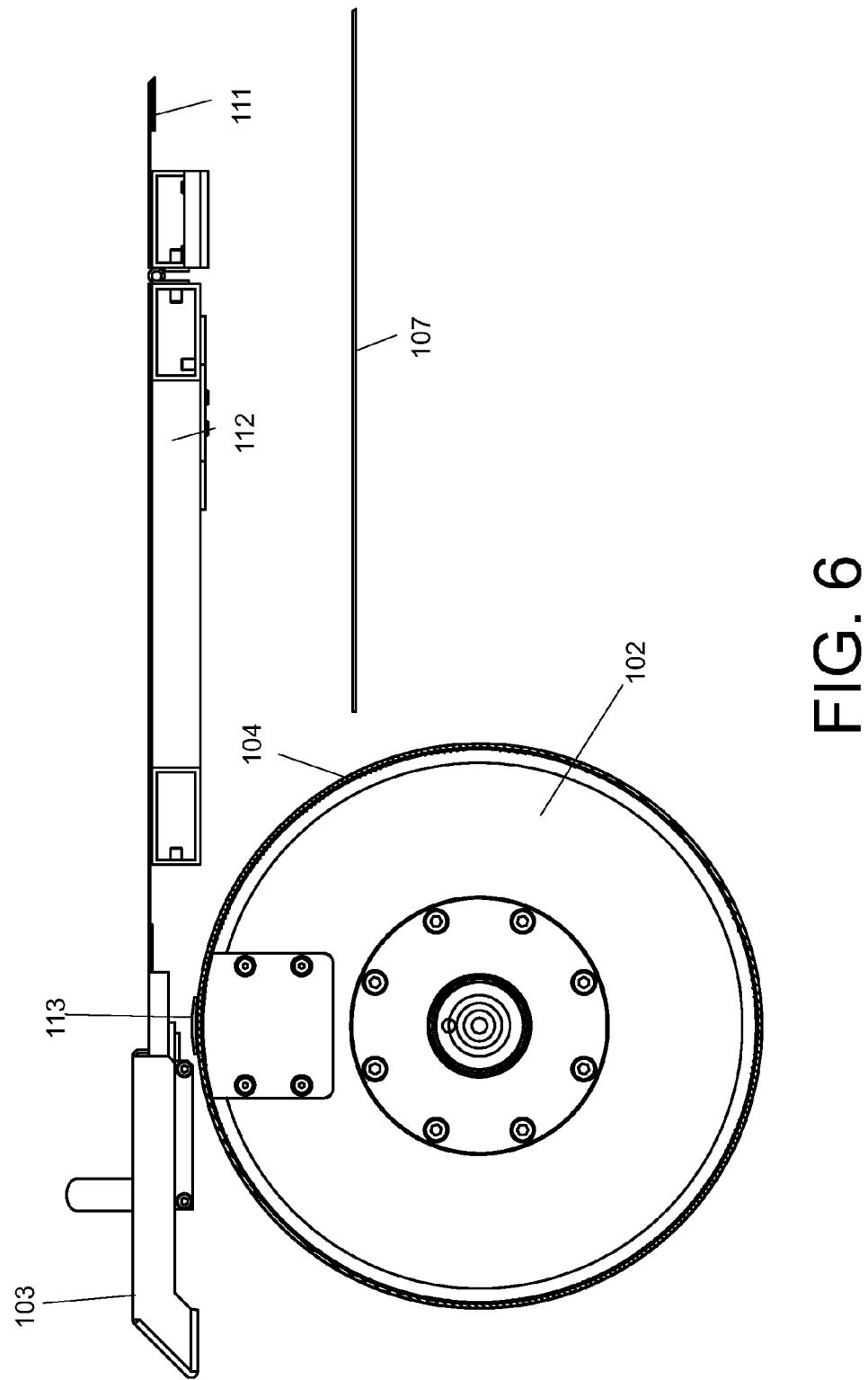
FIG. 6 shows a simplified side view of an embodiment of the imager in a position of a plate loaded onto the surface.

The control system 110 in operation next causes the automated clamp 113 to close to clamp the front edge of the plate onto the drum. The control system 110 in operation next causes a vacuum on the drum surface to be turned on and the drum 102 to be rotated in the counterclockwise direction by one turn. During such rotation of the drum 102, the plate 104 slides from the loading area 106 onto the outer surface drum and is held thereto by the vacuum grooves on the drum surface. In the example, assume the plate has a length approximately equal to the circumference of the outer surface of the drum. The control system 110 in operation, after the rotation of the drum, causes the automated clamp 113 to open so that the rear edge of the plate can fall, and does fall in the gap between the automated clamp 113 and the outer drum surface. The control system 110 in operation then causes the automated clamp 113 to close so that the plate 104 is mounted onto the drum. The control system 110 in operation also then causes the front loading part 112 to tilt back in a clockwise direction until it is co-planar with the rear loading part 111, and also causes the door mechanism 103 to be closed. FIG. 6 shows a simplified side view of the imager in this position of the plate loaded onto the surface. In this example, the plate is now ready for imaging. The imager then images the plate by imaging data as is typical in such an imager.

Figure 7:
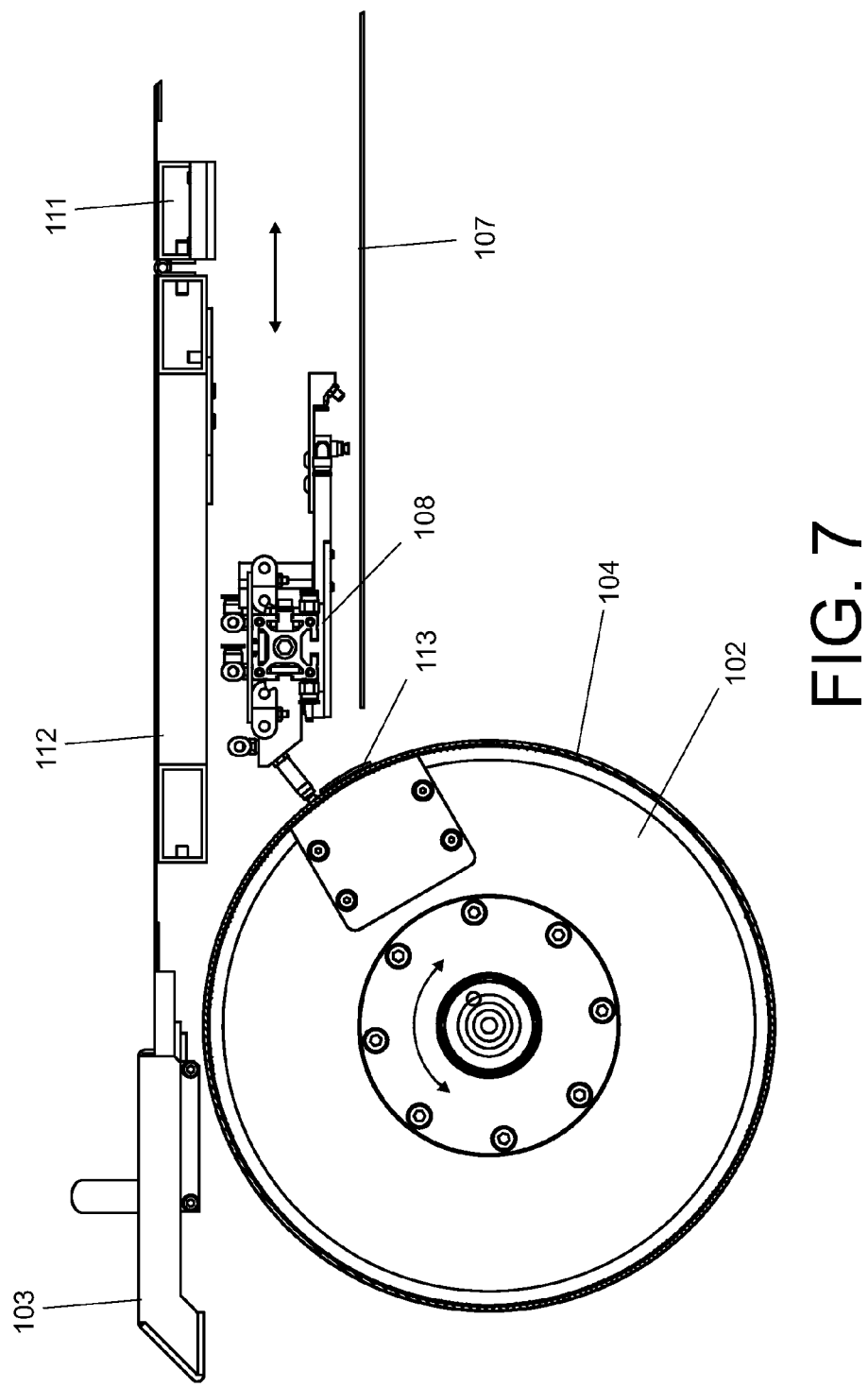
FIG. 7 shows a simplified side view of an embodiment of the imager in a position with the front suction cups in contact with a plate next to the rear edge of the plate.
Figure 8:
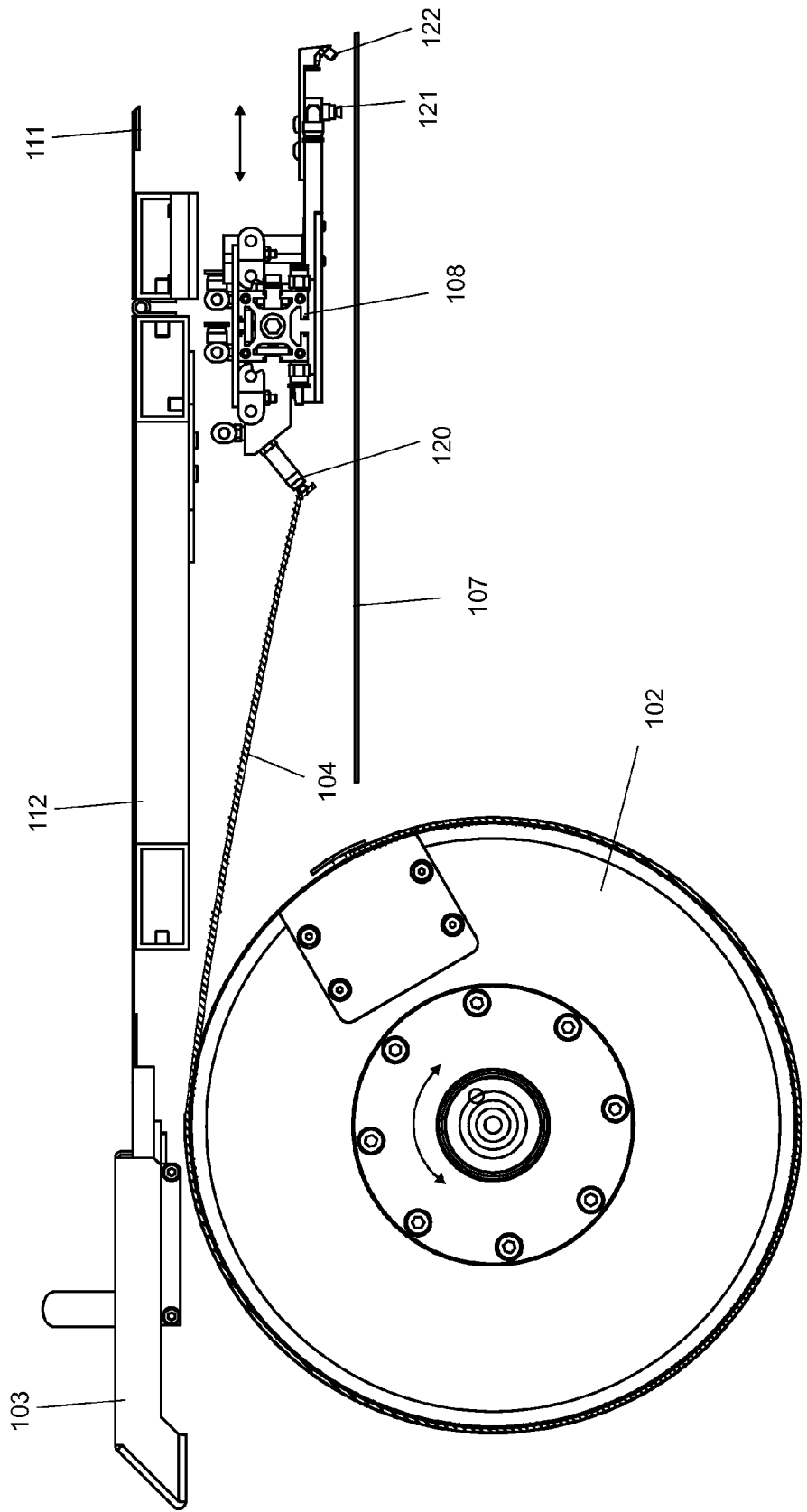
FIG. 8 shows a simplified side view of an embodiment of the imager with a plate removed and the clamp closed.

After the plate is imaged, continuing with the illustrative example, the method includes the automated unloading of the imaged plate under control of the control system 110. Assume the position after imaging is also as shown in FIG. 6 with the plate 104 positioned onto the drum. For unloading, the control system 110 in operation causes the drum 102 to be positioned in a pre-defined unloading position. The control system 110 in operation causes the grabber mechanism 108 to move horizontal to the drum 102 to a plate unloading position in which the set of front suction cups 120 are directly in contact with the plate next to the rear edge of plate 104. FIG. 7 shows a simplified side view of the imager in this position with the front suction cups 120 in contact with the plate next to the rear edge of the plate 104. The control system 110 in operation causes vacuum to be supplied to the set of front suction cups 120 and also causes the automated clamp 113 to open. The control system 110 in operation causes the drum to be rotated clockwise while at the same time causing the grabber mechanism to move back horizontally with the rear edge of the plate 104 held thereto by the front set of suction cups 120 at a speed proportional to the rotational speed of the drum. When the drum has rotated sufficiently, the control system 110 in operation causes the grabber mechanism to continue moving so that the rear edge of the plate 104 is removed from the gap between the opened automated clamp 113 and the outer surface of the drum. The control system 110 in operation then causes the automated clamp 113 to close. FIG. 8 shows a simplified side view with the plate 104 removed and the clamp so closed.

Figure 9:
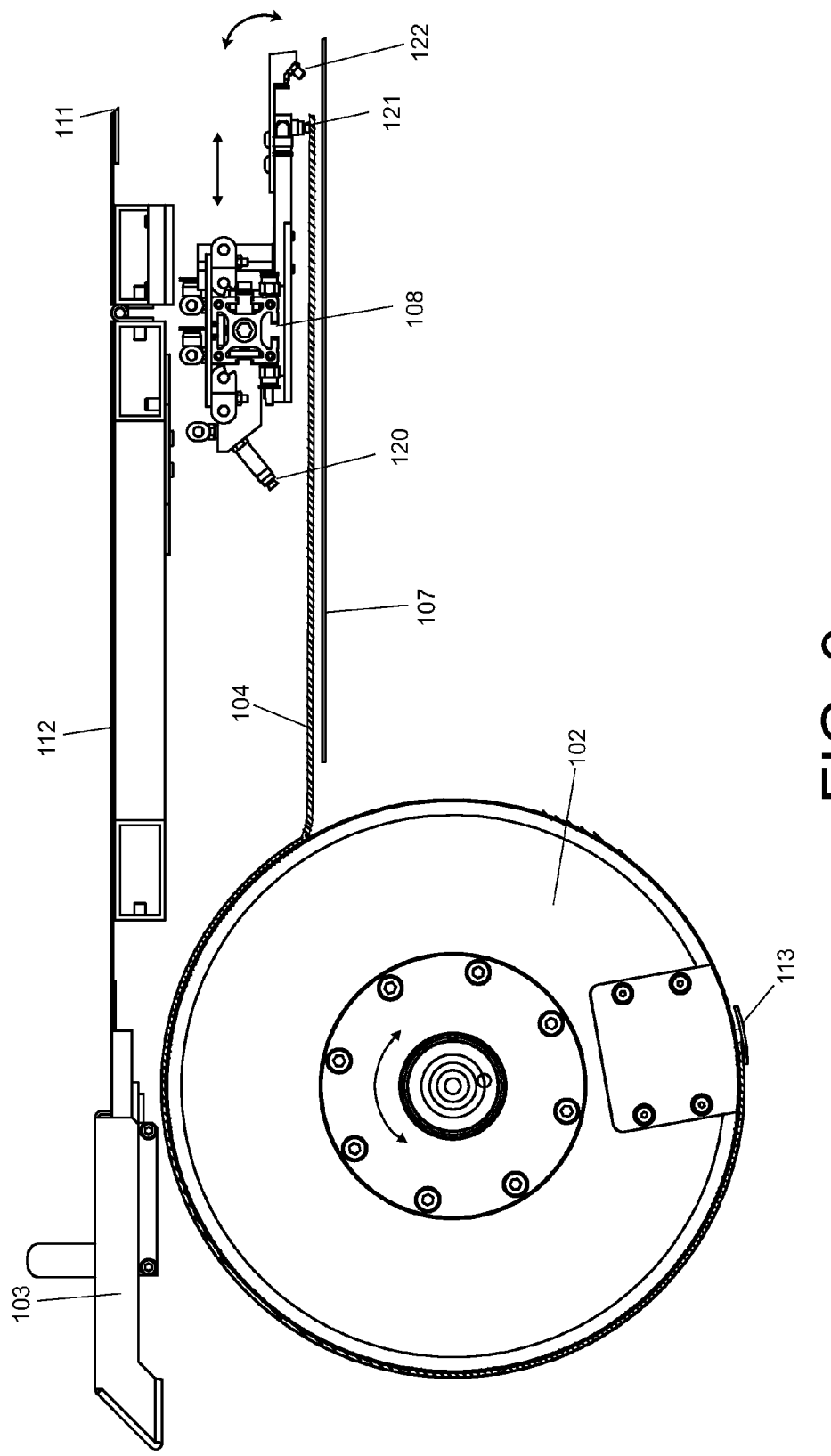
FIG. 9 shows a simplified side view of an embodiment of the system with a plate in such that the combination of the rear set of suctions cups and air injectors are tilted up so that the rear edge of the plate is picked up from the unloading area.

The control system 110 in operation then causes the vacuum to be turned off from the front suction cups 120. As a result, the rear edge of the plate 104 falls down onto the unloading area 107. The control system 110 in operation causes the grabber mechanism to move horizontally in the direction towards the drum 102 to a position in which the rear set of suction cups 121 is positioned over the rear edge of the plate 104. At this position, the control system 110 in operation causes the vacuum supply to the rear suctions cups 121 to be turned on, and the air supply to the air injectors 122 is also turned on. The control system 110 in operation also causes the combination of the suction cups 121 and injectors 122 to tilt down towards the surface of the plate 104 until the vacuum cups are directly in contact with the surface of the plate next to the rear edge of plate 104. The control system 110 in operation then causes the combination of the rear set of suctions cups 121 and air injectors 122 to tilted up so that the rear edge of the plate 104 is picked up from the unloading area 107. FIG. 9 shows a simplified side view of the system with the plate in this position.

Figure 10B:
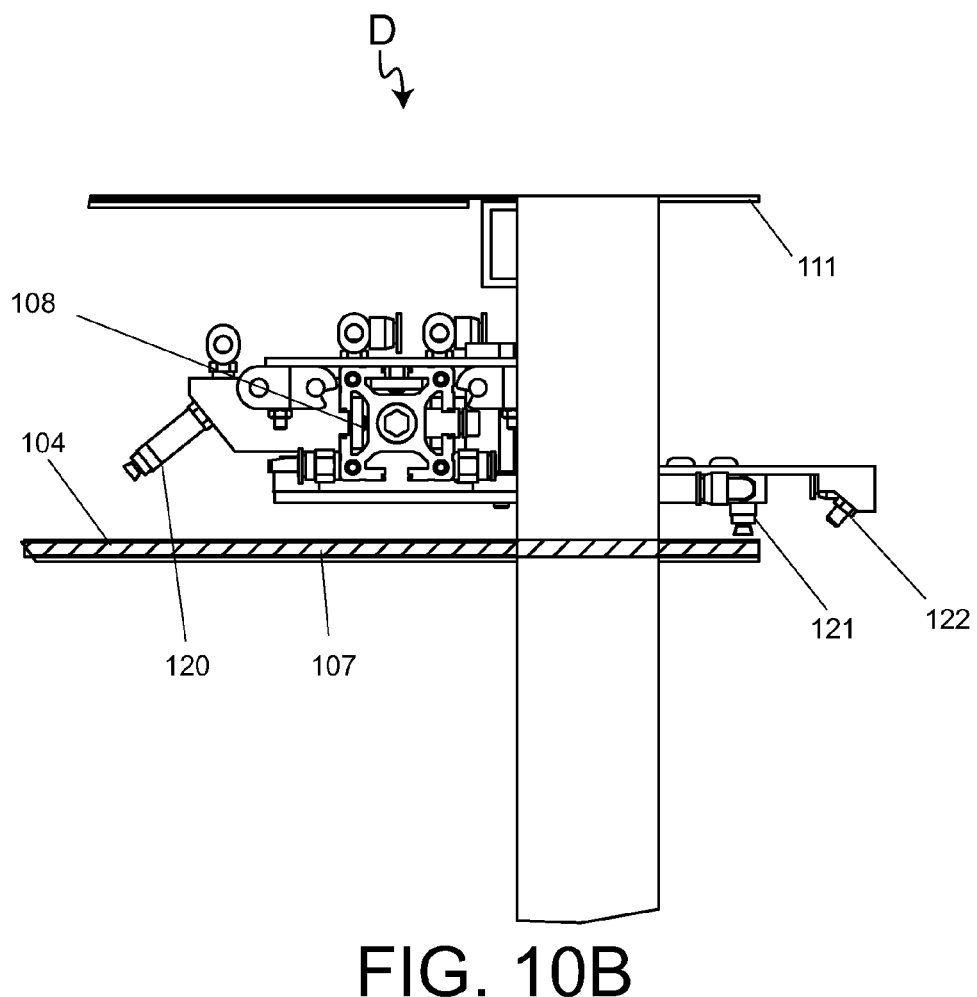
FIG. 10B shows a magnified view of the region marked D in FIG. 10A.

The control system 110 in operation then causes the drum 102 to be rotated in a clockwise direction and at the same time the grabber mechanism 108 to move in the direction towards the rear direction until the automated clamp 113 of the drum 102 is in the upright position. The control system 110 in operation cause the grabber mechanism 108 to continue moving in the rear direction until it reaches and stops at the end of the frame 109. Simultaneously, while the automated clamp 113 of drum 102 is in its upright position, the control system 110 in operation causes the automated clamp 113 to open. The control system 110 in operation causes, once the grabber mechanism is at the end of the frame, the vacuum to the rear suction cups to turn off, and the air to the rear air injectors 122 to be off. As a result, the rear edge of plate 104 falls down onto the unloading table 107. The plate 104 is thus automatically unloaded to an unloaded position on the unloading table 107. FIG. 10A shows an end view of the system with the plate 104 in the unloaded position after such automated unloading. FIG. 10B shows a magnified view of the region marked D in FIG. 10A that includes the grabber mechanism and the rear end of the unloaded plate.

One embodiment of the system further includes one or more irradiator subsystems configured to irradiate the plate with ultraviolet radiation. Irradiating plates that have a sensitized coating such as a LAMS coating with ultraviolet radiation is known in the art. One embodiment of the system includes an irradiator subsystem configured to irradiate the plate from the back side, such a process called back exposure herein, and another embodiment of the system includes an irradiator subsystem configured to irradiate the plate from the top side, such an irradiation process called main exposure herein. One embodiment includes elements that carry out both main exposure and back exposure.

Figure 11A:
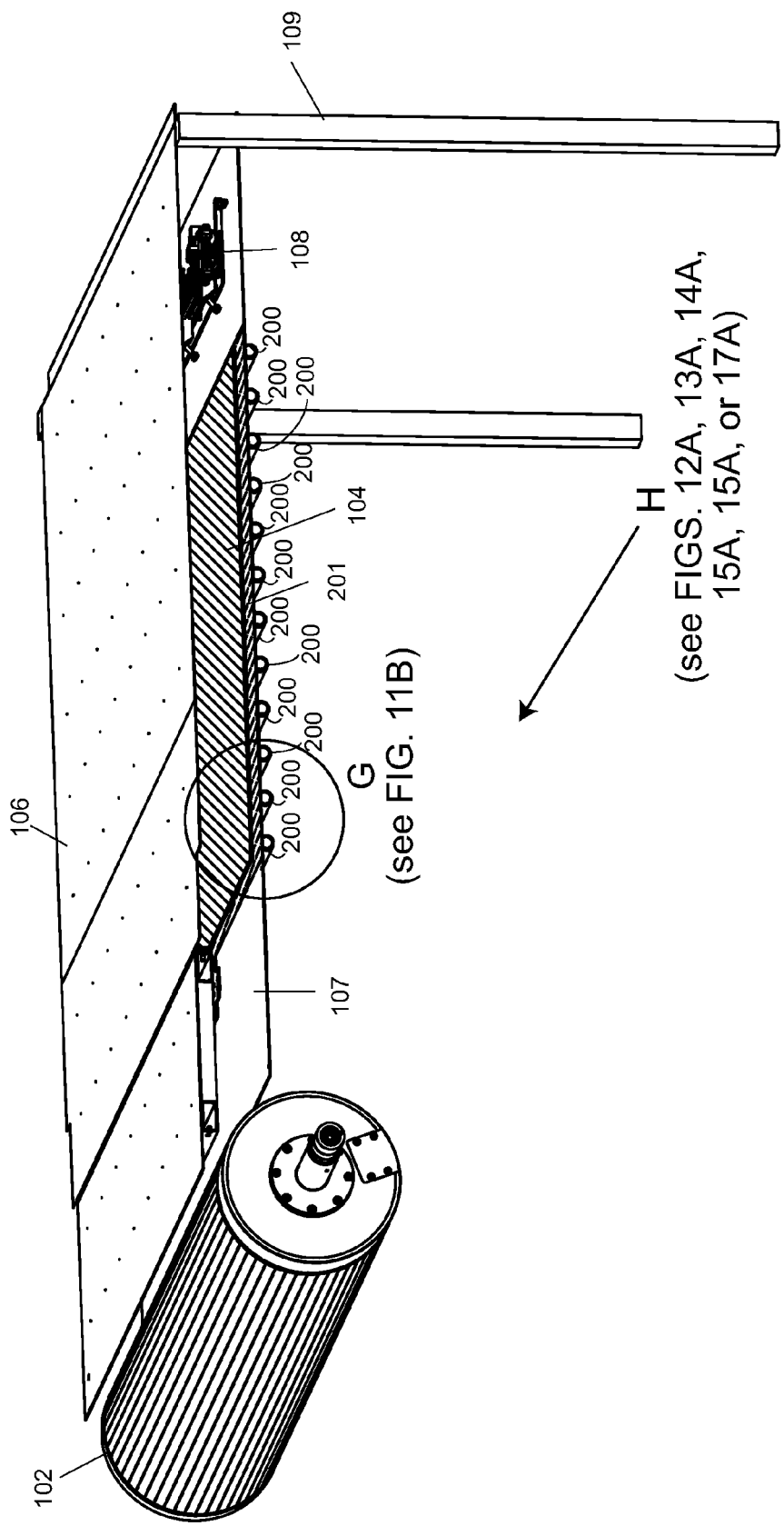
FIG. 11A shows a perspective view of an embodiment of the loader.

FIG. 11A shows a perspective view of an embodiment of the novel loader including an ultraviolet source subsystem, in this version a set of UV sources 200 configured to irradiate the flexographic plate with ultra violet radiation. The ultraviolet source subsystem is controlled by the control system 110. FIG. 11B shows the region denoted by G magnified.

Note that FIGS. 12A, 13A, 14A, 15A, 16A and 17A each show an end view in the direction denoted H in FIG. 11A of a different embodiment in which the respective ultraviolet source subsystem has different alternate configurations in order to illustrate the way the ultraviolet source subsystem is configured may be different in different versions.

Figure 12A:
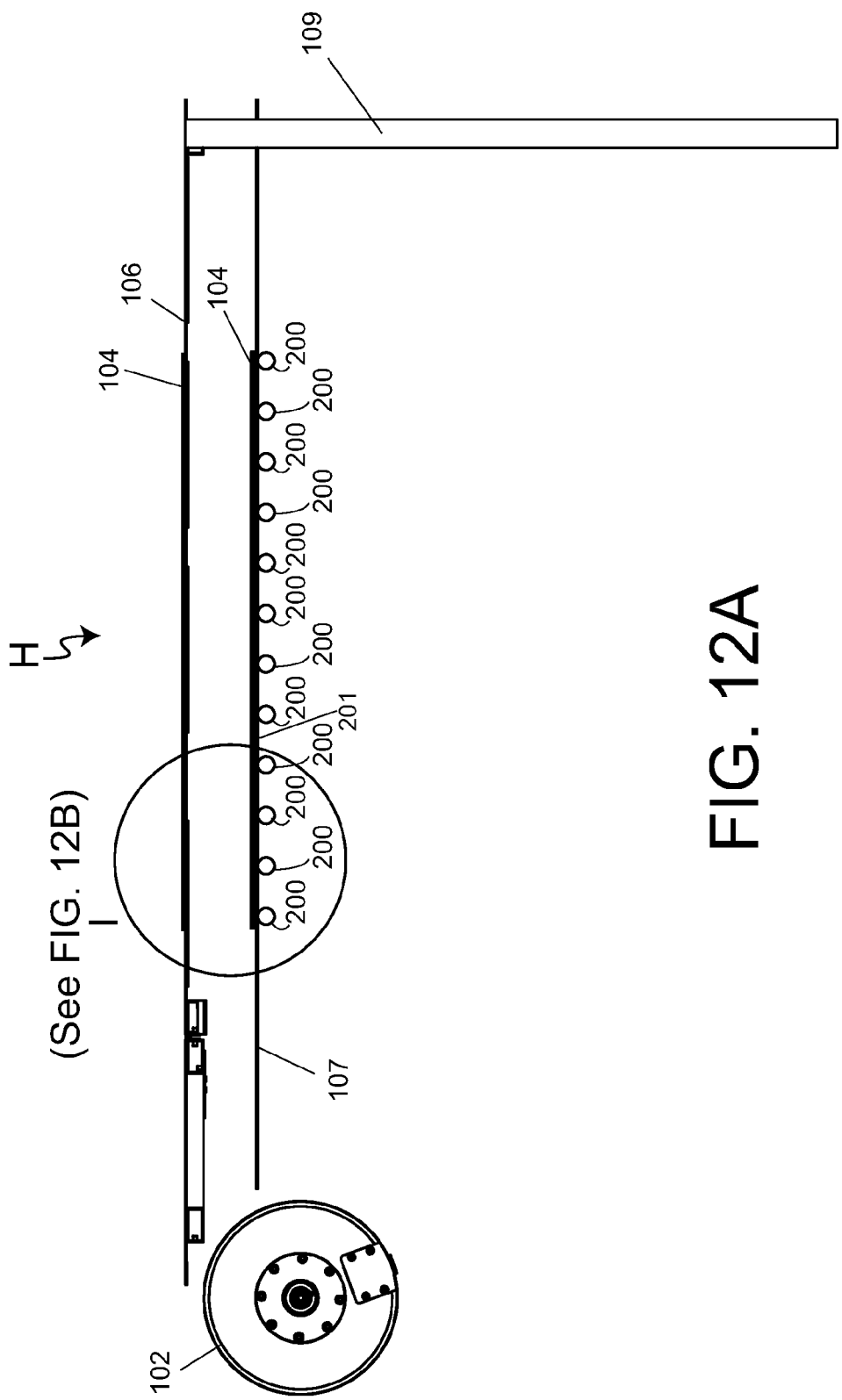
FIG. 12A shows a side view of an embodiment of the system in simplified form where the imager is only represented by the drum, and includes a first embodiment of an ultraviolet source subsystem.

FIG. 12A shows a side view of the system in simplified form where the imager is only represented by the drum, and includes a first embodiment of the ultraviolet source subsystem. FIG. 12B shows the area marked I magnified. This embodiment includes a plurality of UV sources 200 arranged under the unloading area 107. The unloading area 107 includes ultraviolet translucent material 201 between plate 104 and the UV source 200. As the plate 104 is unloaded automatically under control of the control system 110, the plate is positioned directly over the plurality of UV sources 200. The control system 110 is configured in operation to cause the plate to be exposed for a programmable amount of time for back exposure, and, after the back exposure is complete, to cause the grabber mechanism to pick the plate up automatically and to move the plate to the unloading position.

Figure 13A:
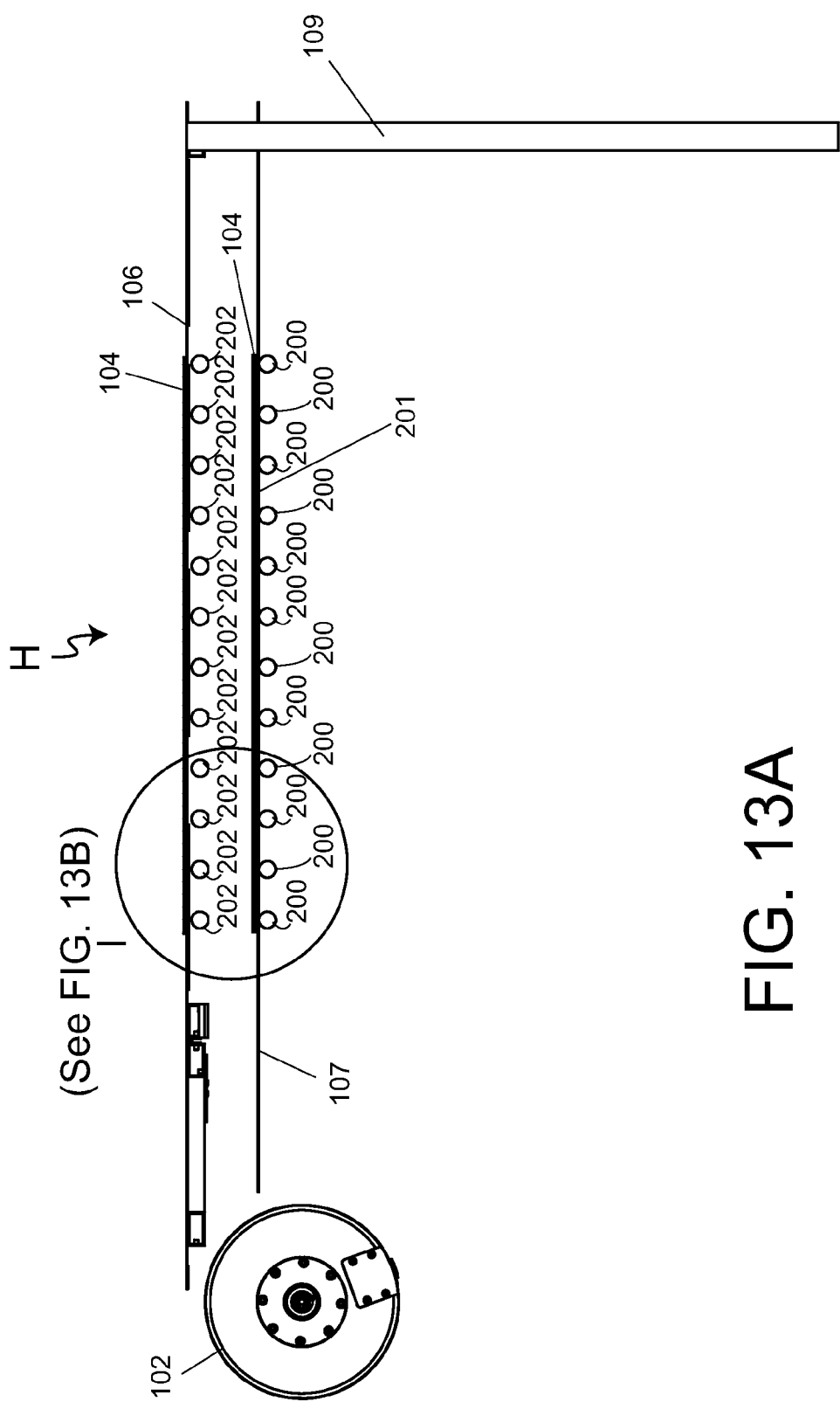
FIG. 13A shows a side view of an embodiment of the system in simplified form where the imager is only represented by the drum, and includes a second embodiment of an ultraviolet source subsystem.
Figure 13B:
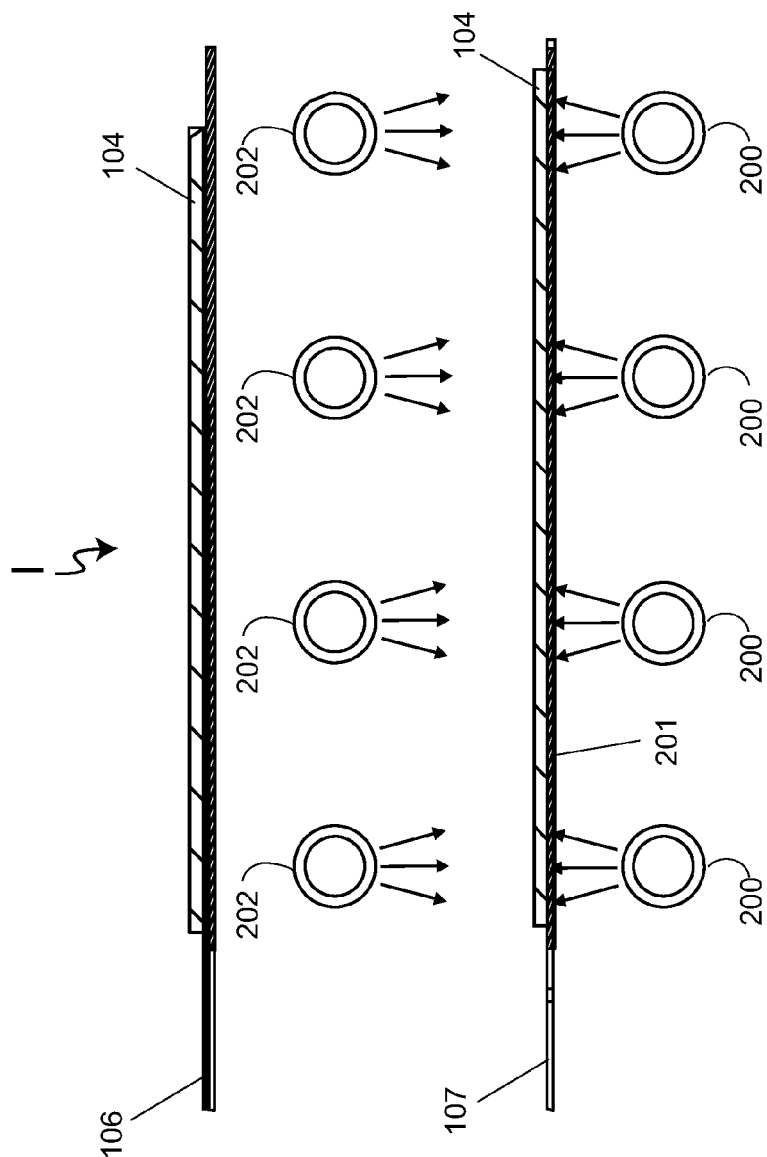
FIG. 13B shows the area marked I in FIG. 13A magnified.

FIG. 13A shows a side view of the system in simplified form where the imager is only represented by the drum, and includes a second embodiment of the ultraviolet source subsystem. FIG. 13B shows the area marked I in FIG. 13A magnified. In FIGS. 13A and 13B, the ultraviolet source subsystem includes a first plurality of UV sources 200 positioned to be under the unloading area 107 and a second plurality of UV sources 202 over the plate 104 lying on the unloading area 107. This second plurality of UV sources 202 is used for main exposure of the plate 104 after unloading. In one embodiment, the control system 110 is configured in operation to cause the plate 104 on the unloading area 107 to be irradiated from the top and also from the bottom after its automatic unloading from the drum for respective programmable amounts of time on the top and bottom.

Figure 14A:
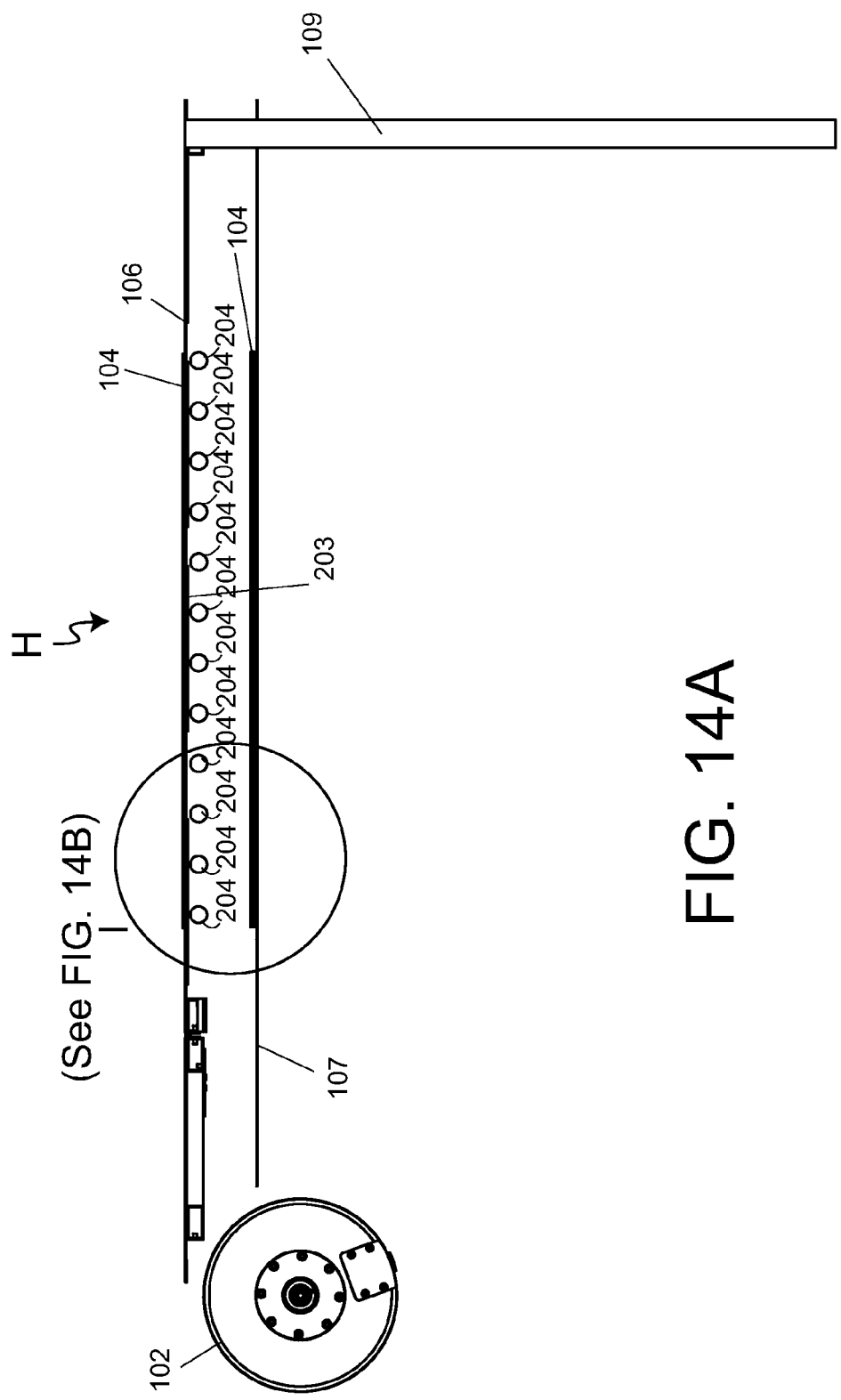
FIG. 14A shows a side view of an embodiment of the system in simplified form where the imager is only represented by the drum, and includes a third embodiment of an ultraviolet source subsystem.
Figure 14B:
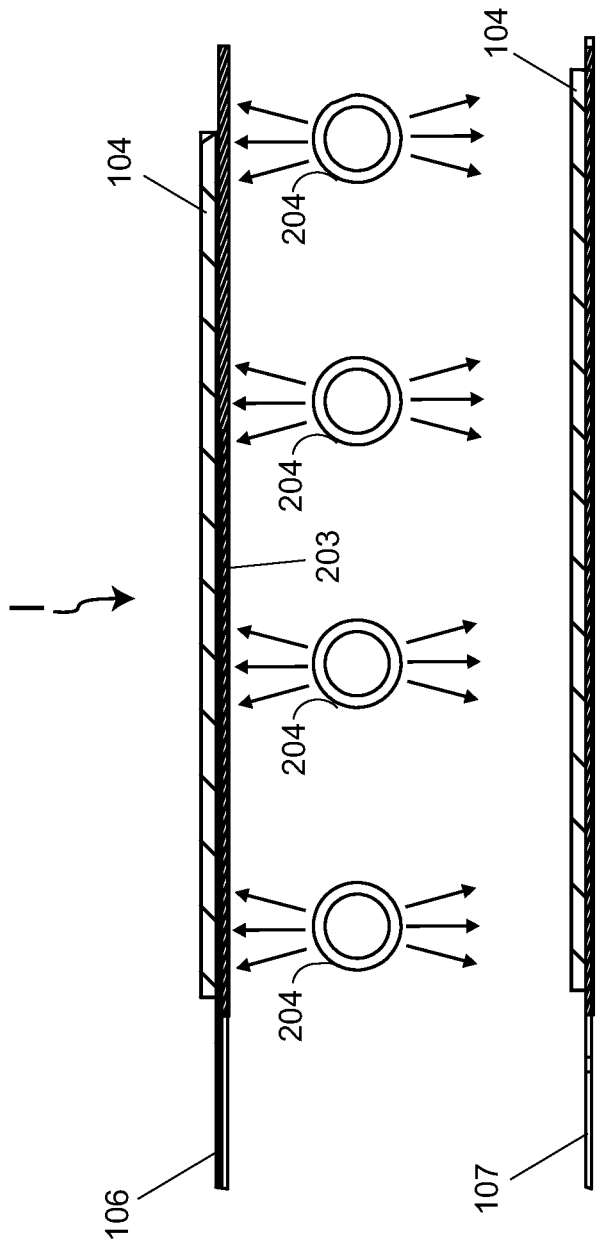
FIG. 14B shows the area marked I in FIG. 14A magnified.

FIG. 14A shows a side view of the system in simplified form where the imager is only represented by the drum, and includes a third embodiment of the ultraviolet source subsystem. FIG. 14B shows the area marked I in FIG. 14A magnified. FIGS. 14A and 14B show ultraviolet source subsystem with a plurality of UV sources 204 between plate 104 on unloading area 107 and loading area 106. The loading area 106 under plate 104 includes ultraviolet translucent material 203. The control system is configured in operation to cause a first plate 104 on the loading area 106 to be irradiated from the back side prior to the plate being loaded, while at the same time to irradiate a different, already imaged plate on the unloading system from that imaged plates top side. In an alternate version, the same plate 104 is loaded automatically onto the loading area 106 and irradiated from its back side by the set of sources 204, then loaded automatically onto the drum 102, then removed to the unloading area where it is irradiated from the top for a programmable amount of time, all under control of the control system 110.

Figure 15A:
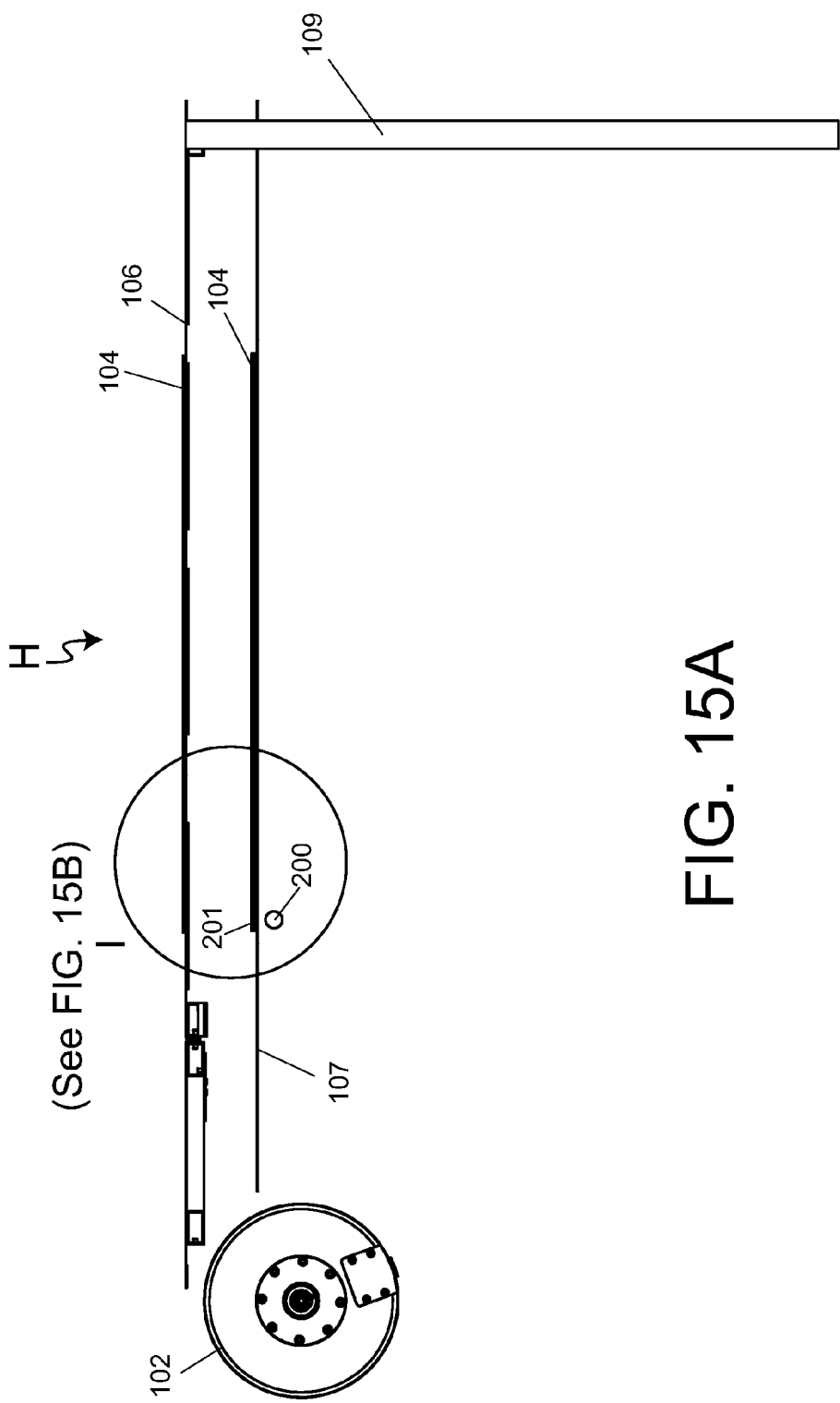
FIG. 15A shows a side view of an embodiment of the system in simplified form where the imager is only represented by the drum, and includes a fourth embodiment of an ultraviolet source subsystem.
Figure 15B:
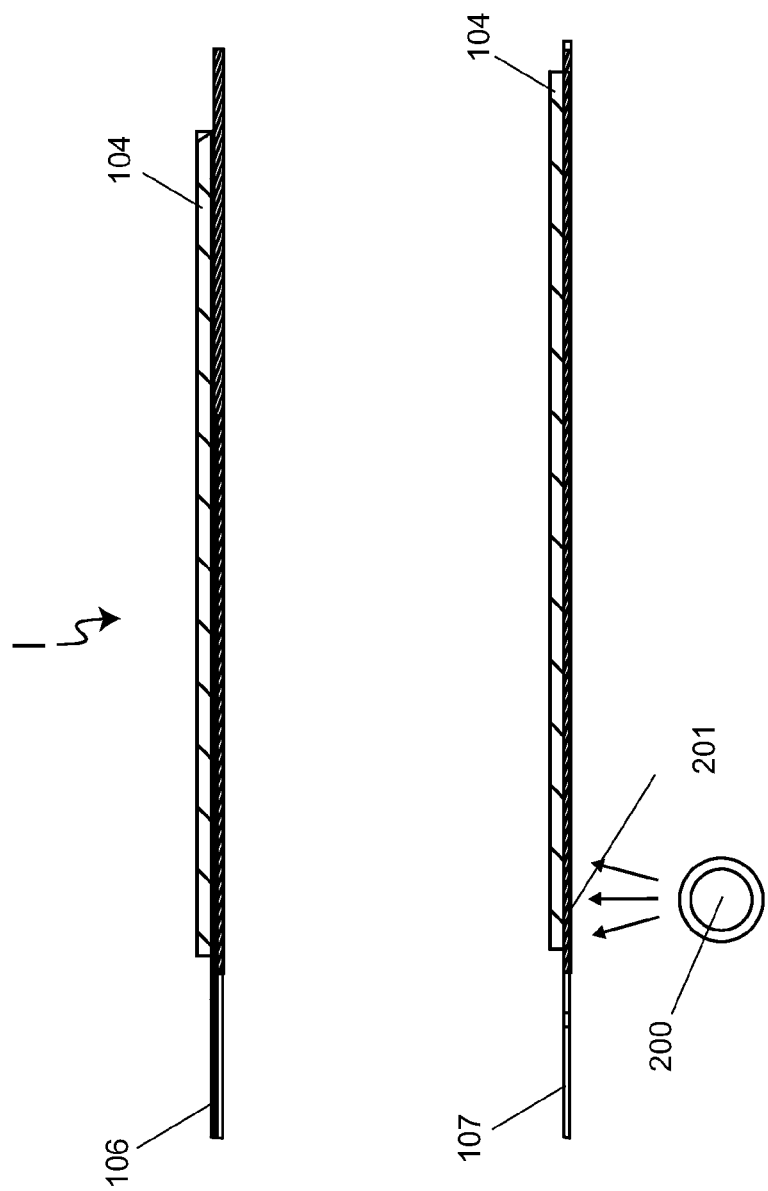
FIG. 15B shows the area marked I of FIG. 15A magnified.

FIG. 15A shows a side view of the system in simplified form where the imager is only represented by the drum, and includes a fourth embodiment of the ultraviolet source subsystem. FIG. 15B shows the area marked I of FIG. 15A magnified. FIGS. 15A and 15B show a system with an ultraviolet source subsystem that includes one UV source 200 under the unloading area 107. The unloading area 107 includes translucent material 201 over the UV source 200. The control system in operation causes the UV source to be on while the plate 104 is moved over the source at a speed programmed so that each part of the plate is exposed from the back side for a required amount of time to provide adequate back exposure.

Figure 16A:
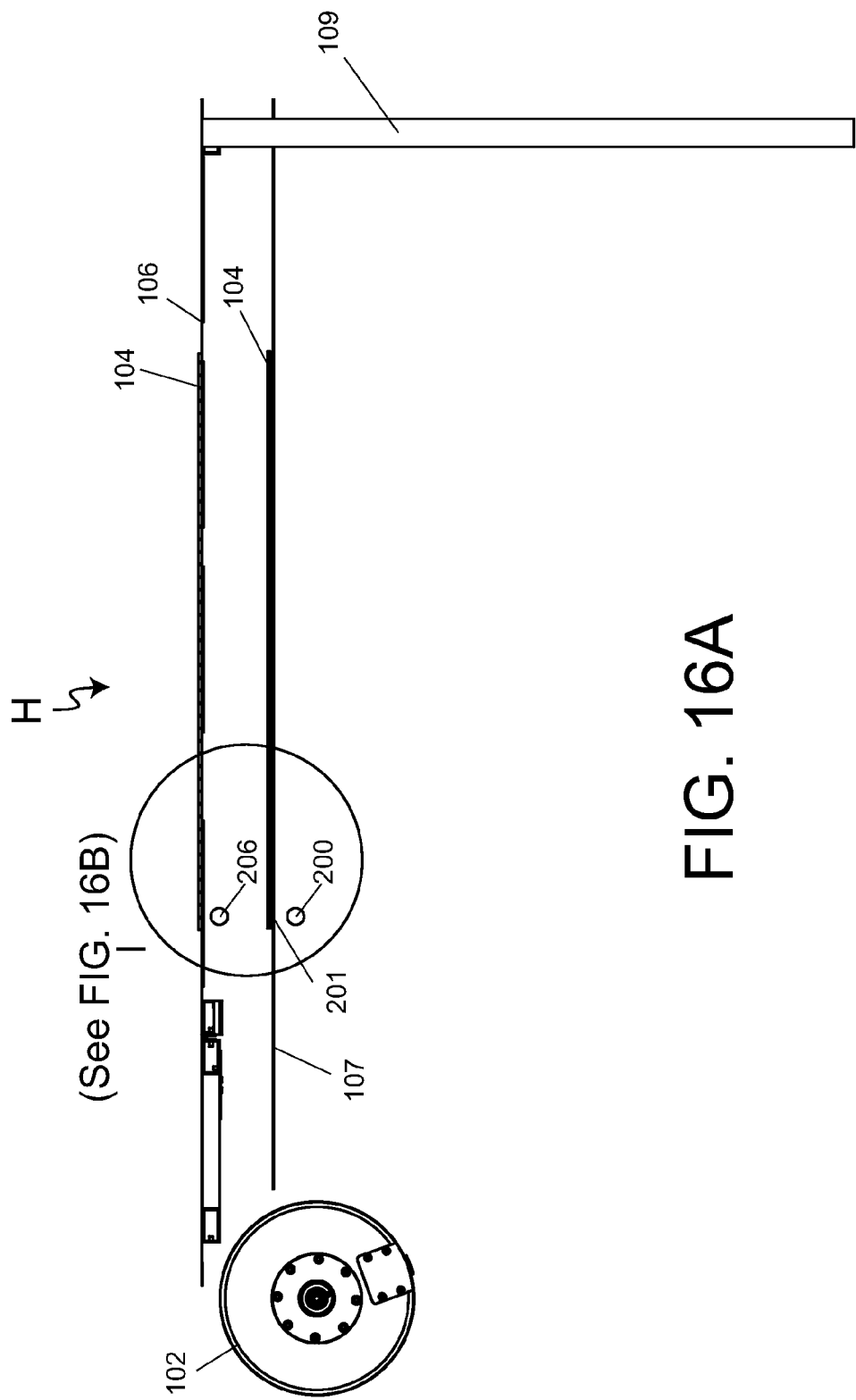
FIG. 16A shows a side view of an embodiment of the system in simplified form where the imager is only represented by the drum, and includes a fifth embodiment of an ultraviolet source subsystem.
Figure 16B:
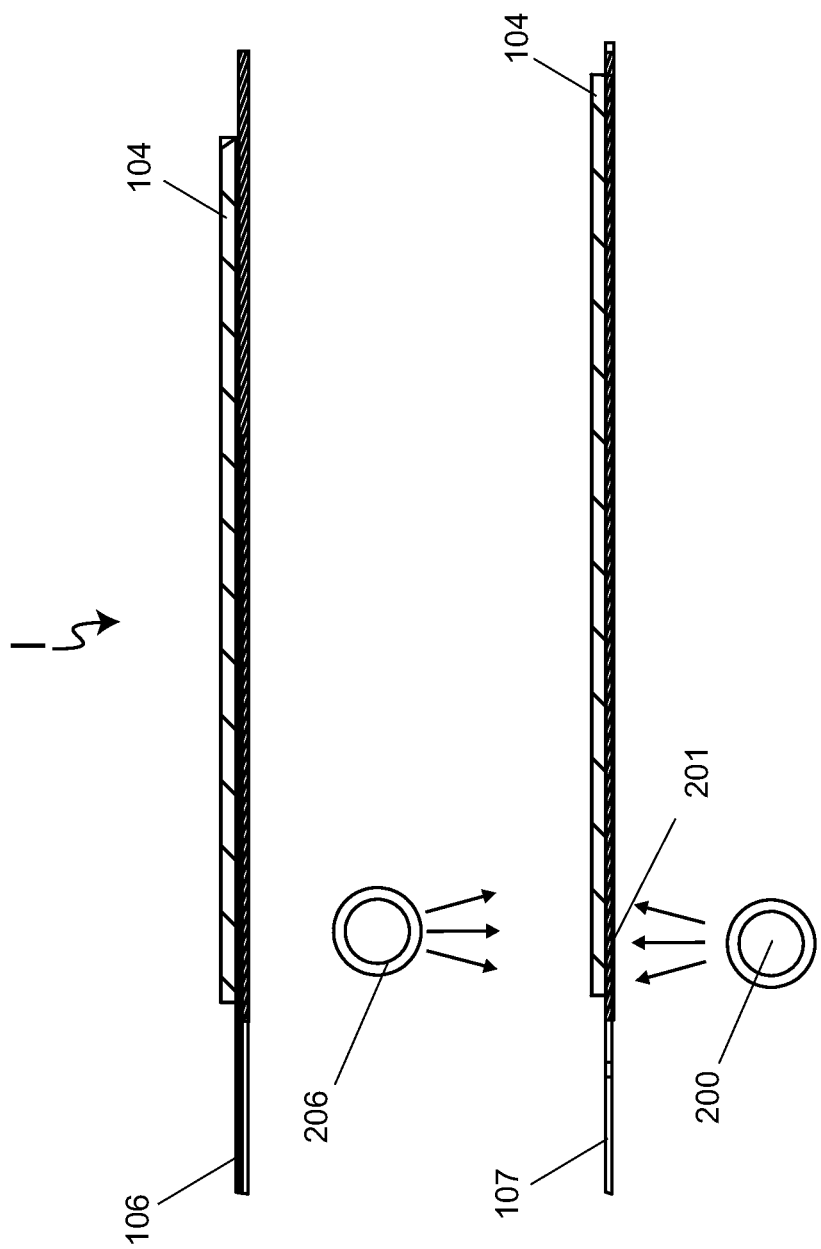
FIG. 16B shows the area marked I of FIG. 16A magnified.

FIG. 16A shows a side view of the system in simplified form where the imager is only represented by the drum, and includes a fifth embodiment of the ultraviolet source subsystem. FIG. 16B shows the area marked I of FIG. 16A magnified. FIGS. 16A and 16B shows an ultraviolet source subsystem that includes one UV source 206 under loading area 106 configured to be able to irradiate a plate from the plate's top while the plate is passing under it. The ultraviolet source subsystem also includes a second UV source 200 under the unloading area 107, such an unloading area 107 including translucent material 201 over the UV source 200. The control system in operation causes the UV sources 206 and 200 to be on while the plate 104 is moved under the source 206 and over the source 200 at a speed programmed so that each part of the plate is exposed from the back side for a required amount of time to provide adequate back exposure and from the top to provide adequate main exposure.

Figure 17A:
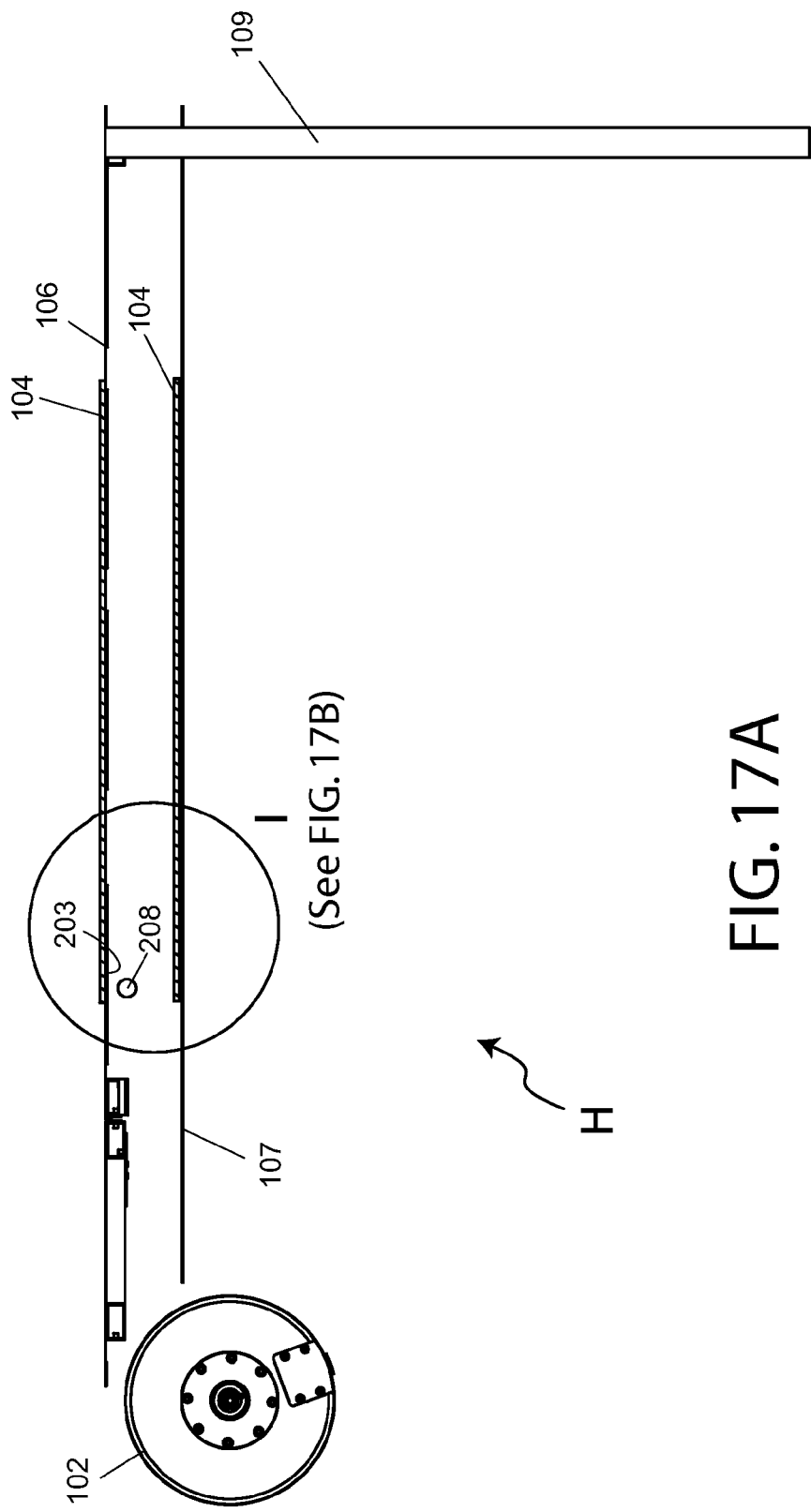
FIG. 17A shows a side view of an embodiment of the system in simplified form where the imager is only represented by the drum, and includes a sixth embodiment of an ultraviolet source subsystem.
Figure 17B:
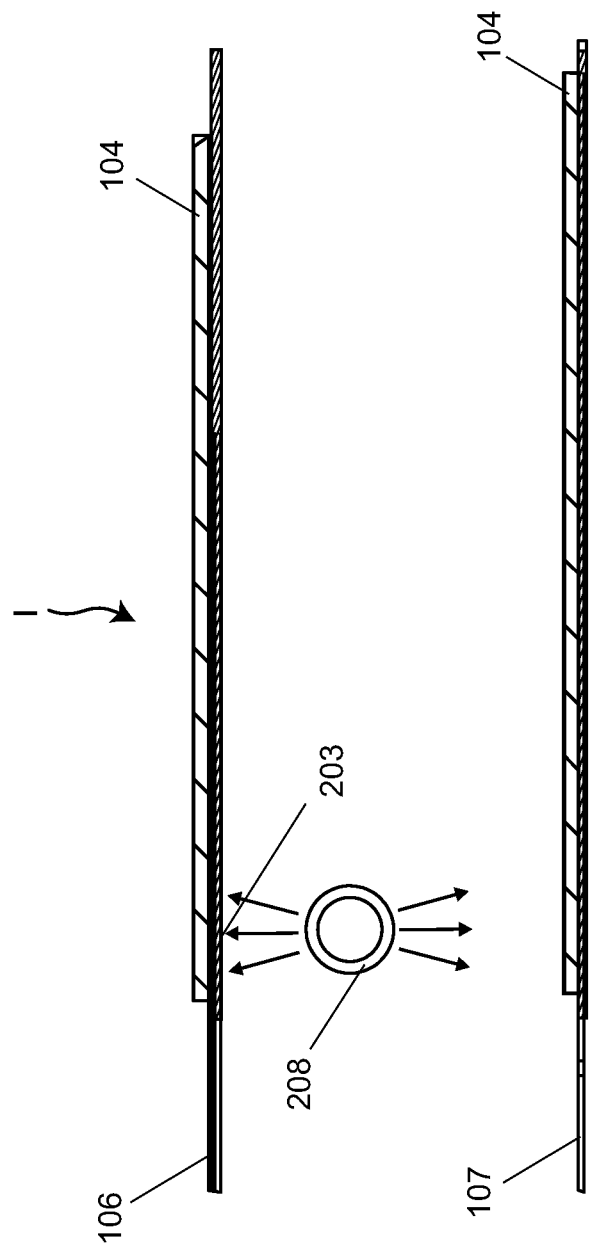
FIG. 17B shows the area marked I in FIG. 17A magnified.

FIG. 17A shows a side view of the system in simplified form where the imager is only represented by the drum, and includes a sixth embodiment of the ultraviolet source subsystem. FIG. 17B shows the area marked I in FIG. 17A magnified. FIGS. 17A and 17B show an ultraviolet source subsystem that includes one UV source 208 under loading area 106 where the loading area 106 includes translucent material 203 over the UV source 208. The control system is configured in operation to cause a first plate 104 moving on the loading area 106 while loading to be irradiated from the back side prior to the plate being loaded. The control system is configured in operation also to cause an imaged plate to be irradiated from its top during automated unloading. The speeds of motion are programmed so that adequate back exposure is provided to a plate prior to imaging, and so that adequate main exposure is provided from the same source 208 to the plate after imaging.

While one set of embodiments is for what is called herein semi-automatic operation according to which a plate is brought to the loading area 106 manually, another set of embodiments is for what is called herein fully-automatic operation according to which the placing of a plate onto the loading area 106 is automated. In one fully automatic embodiment, a mechanism under control of the control system 110 picks up a plate from a stack of plates, places the picked up plate at a loading position on the loading area 106, and in the case that a protective sheet is included on the plate, removes the protective sheet.

Figure 18:
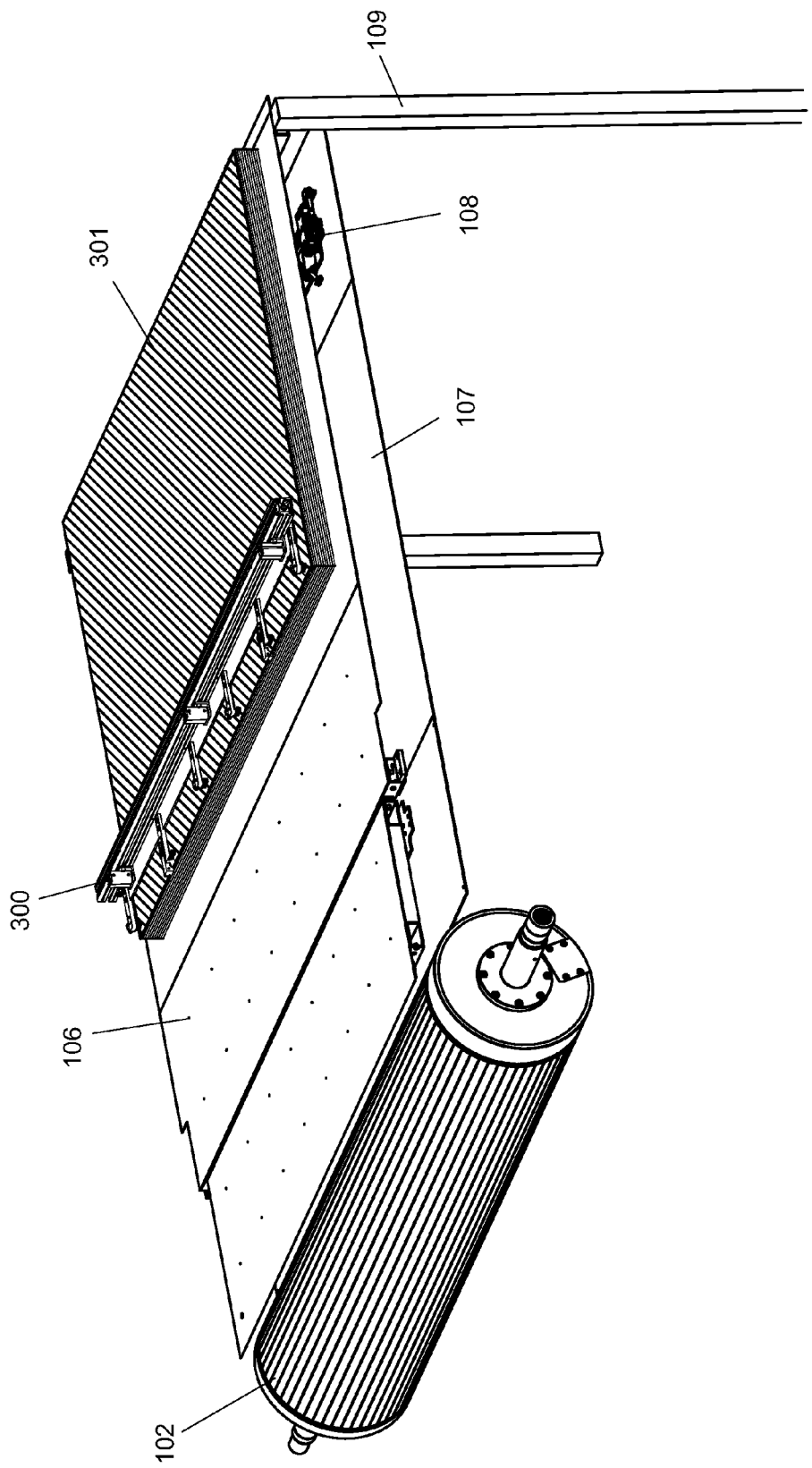
FIG. 18 shows a simplified diagram of an embodiment of a system that includes an element operative to carry out automatic loading.

FIG. 18 shows an embodiment of a system that includes an element operative to carry out automatic loading. The system includes a plate handler 300 controlled by the control system 110 configured to grab a plate 104 from a stack of plates 301 and to move the plate to the loading position on the loading area 106. The plate handler 300 also is configured to remove, under control of the control system 110, the protective sheet from the top of the plate 104 in the case the plate has such a protective sheet.

Figure 19:
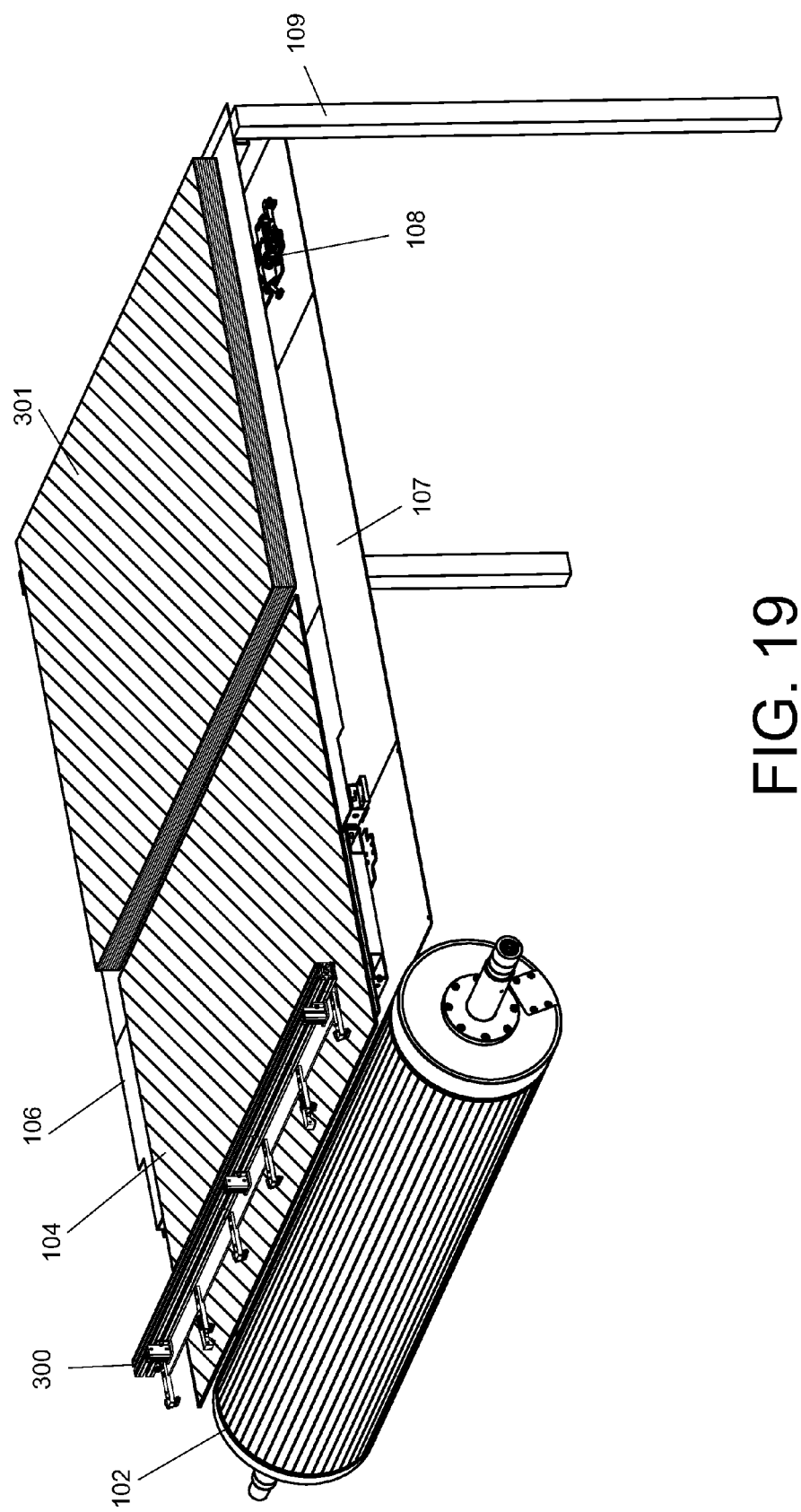
FIG. 19 shows a simplified diagram with the position of the plate handler of the embodiment of FIG. 18 after a plate has been moved onto the loading position on a loading area.

FIG. 19 shows the position of the plate handler 300 after the plate has been moved onto the loading position on the loading area 106.

How to carry out the automatic loading of the plate and further how to remove the protective sheet from the top of the plate is described—in a slightly different configuration from that shown in FIGS. 18 and 19—in U.S. Pat. No. 7,000,543 to Klein, et al. titled METHOD AND APPARATUS FOR LOADING AND UNLOADING FLEXOGRAPHIC PLATES FOR COMPUTER-TO-PLATE IMAGING. The contents of such U.S. Pat. No. 7,000,543 are incorporated herein by reference.

The device in U.S. Pat. No. 7,000,543 includes, rather than a stack of plates, a plate magazine containing a plurality of flexographic plates. One embodiment can contain at least 10 plates, e.g., about 20 plates. The magazine of one embodiment of U.S. Pat. No. 7,000,543 includes a plurality of compartments, one compartment for each plate. Each flexographic plate is pre-loaded in its own compartment, e.g., without the separation sheet that may have been used between plates in a stack of flexographic plates. In one embodiment of U.S. Pat. No. 7,000,543 applicable also to an embodiment of the present invention, the protective sheet remains over the LAMS coating. In one version, the protective sheet is removed directly prior to the plate being mounted on the drum. In another embodiment, the protective sheet is partially removed prior to the loading, but is mostly still on top of each flexographic plate. The removal of the rest of the protective sheet occurs automatically at the same time as the mounting.

In one embodiment of U.S. Pat. No. 7,000,543 applicable also to an embodiment of the present invention, the magazine includes a frame and a set of compartments arranged vertically, each compartment designed for holding a single flexographic plate. The compartments are movable up and down. A lifting mechanism is configured to lift and lower the compartments under control of the control system 110. Initially, each of the compartments is at its respective rest vertical position and a common rest horizontal position. In one embodiment of U.S. Pat. No. 7,000,543 applicable also to an embodiment of the present invention, the lifting mechanism moves one compartment at a time vertically between its rest vertical position and a loading vertical position at which the compartment is at a height at which the compartment is horizontally movable back and forth from the rest horizontal position to a loading horizontal position flush with a loading area 106. The lifting mechanism 104 further can move each compartment at the rest horizontal position up and down from and to the loading vertical position to and from a respective imaged vertical position.

In one embodiment of U.S. Pat. No. 7,000,543 applicable also to an embodiment of the present invention, there is a movable horizontal bottom panel 332 that when moved beneath the horizontal area 106 provides an opening for access from below the loading area 106.

In one embodiment of U.S. Pat. No. 7,000,543 applicable also to an embodiment of the present invention, includes the automatic loading of a plate onto the loading area 106 from the magazine and then, as described above onto the drum, and another aspect is the automatic removal of a protective sheet from the top of the plate during the loading onto the loading area 106 and drum. These aspects are controlled under control of the control system 110.

For embodiments such as shown in FIGS. 18 and 19 that do not include the magazine with a single plate in each compartment, but rather are for picking up a plate from a stack of plates 301, the grabber mechanism described herein and in U.S. Pat. No. 7,000,543 can be readily adapted to remove a plate from a stack of plates rather than from a compartment. The description below, however, assumes a compartment from the magazine. How to modify the description below to operate for removal from a stack as shown in FIGS. 18 and 19 would be clear to those in the art.

For example, in the embodiments shown in FIGS. 18 and 19, the plate handler 300 not only is movable horizontally towards and away from the imager, but also can move vertically to accommodate the height of the stack of plates. In one embodiment, the horizontal movement is by one or more motors under control of the control system 110, and the vertical movement of the plate handler 300 is hydraulic using at least one piston, under control of the control system 110.

The system in a "fully automatic" embodiment includes a first grabber mechanism 335 that includes a section 333 to maintain the plate horizontal, and that includes a grabber set of vacuum suction cups arranged as a row. In the compartment version that is described in U.S. Pat. No. 7,000,543, when the compartment is at its loading horizontal position flush with a loading area 106, the control system 110 is configured in operation to cause the first mechanism with the grabber set of suction cups to grab the plate with the protective sheet on top and to move the plate and sheet away from the compartment (or stack in the stack of plates version) towards the drum on the loading area 106, such that the edge of the plate and protective sheet is above the opening formed by moving away a bottom panel 332.

When the plate is at the intermediate position over the opening 307, the control system in operation causes the first mechanism 335 to let go of and move away from the protective sheet and plate. In particular, the first mechanism rotates such that the edge of the plate may be bent away from the surface 106. The part 333 of the grabber mechanism 335 maintains the adjacent part of the plate and protective sheet horizontal.

One embodiment includes a bending device that in one embodiment includes a wheel that rolls against the edge of the plate and moves back and forth across the plate edge. This bends a part, e.g., approximately 10 mm of the end of the plate and protective sheet to an angle that is adjustable to between 30 and 90 degrees, depending on the plate type. The bending device moves back and forth across the plate edge between one and three times depending on the plate type. The purpose of the bending by the bending device is to loosen the protective sheet from the plate at the edge region. Otherwise, the protective sheet tends to stick heavily to the LAMS coating. The bending device might also be a knife-type device instead of a wheel.

At this stage, the control system 110 is configured in operation to cause the first mechanism 335 that includes the grabber set of suction cups arranged as a row to move onto the protective sheet along the width in the strip area separated from the plate. Also at this stage, the control system causes a second mechanism that includes another set of vacuum holders (suction cups) arranged as a row to move to be under the edge of the plate through the opening around the loading area 106. The order of the moving is not important, i.e., whether the top protective sheet or the bottom of the plate is held first. Vacuum is applied to the first and second set of vacuum holders. The second set maintains the plate at the horizontal surface, while the first mechanism lifts, e.g., by tilting tilts the protective sheet away from the plate.

In one embodiment, the grabber set of suction cups of the first mechanism is arranged relative to the other set of suction cups such that the top (grabber set) suction cups are interleaved with the bottom (the other set) suction cups. However, the inventors discovered that the mechanisms still cooperate to produce the desired result, albeit not as well, even when the top and bottom sets of suction cups are not so interleaved, e.g., are positioned at the same location when respectively adhering to the protective sheet and to the bottom of the plate. Thus, the invention is not restricted to the interleaving of the grabber set and other set of suction cups.

The control system 110 in operation causes the vacuum to the bottom set of suction cups to be removed, and the second mechanism of the other set (the bottom set) of suction cups to move away. The movable panel 332 now moves back to close the opening to form a substantially horizontal surface.

The grabber mechanism 335 with the vacuum holders holding the protective sheet now slides the plate and protective sheet towards the drum under control of the control system 110.

Once the plate edge is located at the loading area 106, and, as described above, clamped to the drum, two actions occur. The first mechanism moves horizontally back to its horizontal rest position close to being over the movable part 332. The first set of suction cups maintains hold onto the protective sheet such that the sheet is partially peeled away.

The protective sheet is now transported to a trash compartment.

In one embodiment, an anti-static device in the form of a wire across the width of the plate is included to remove static electricity from the combination of the plate and protective cover during the removal of the protective cover from the drum and automatic loading onto the drum. This ensures easier removal of the protective cover compared to when no anti-static device is used.

The unloading process proceeds in the reverse, except, of course, that there is now no protective sheet on top of the plate.

Figure 20A:
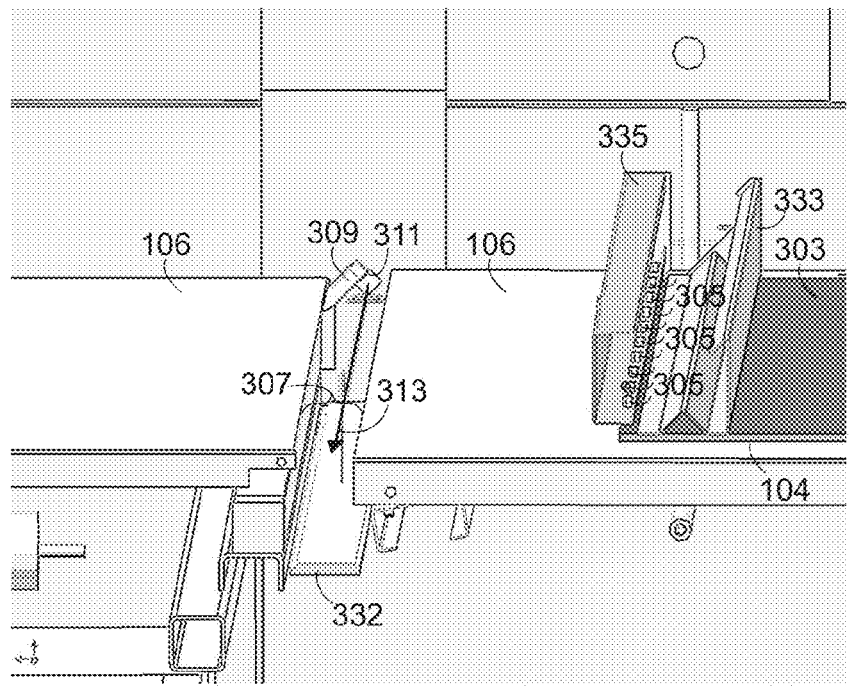
FIGS. 20A-20Y respectively correspond to FIGS. 5A-5Y of U.S. Pat. No. 7,000,543 and show a sequence of automatic loading onto a loading area, and the automatic removal of the protective sheet aspects of one embodiment the invention.
Figure 20B:
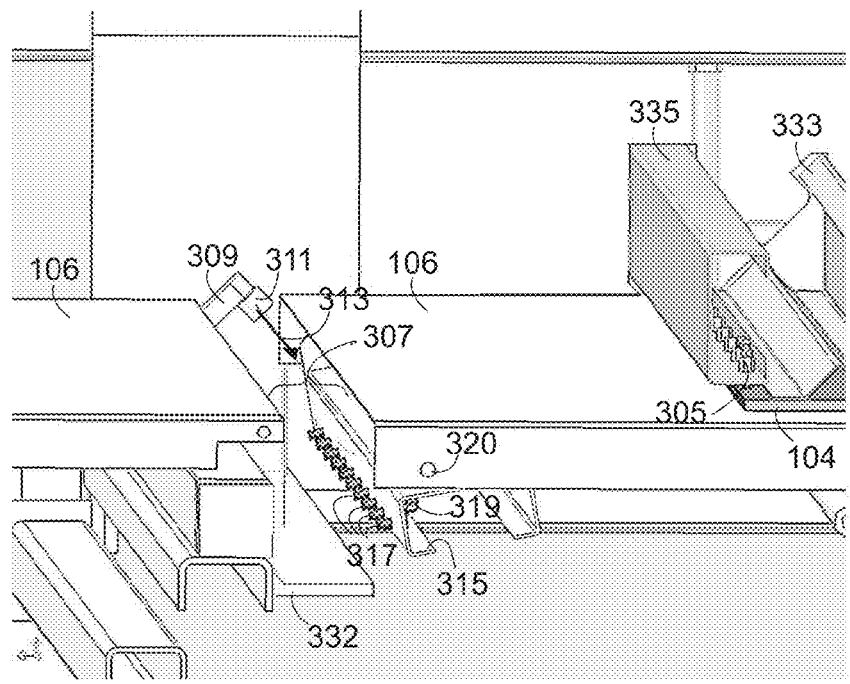
Figure 20C:
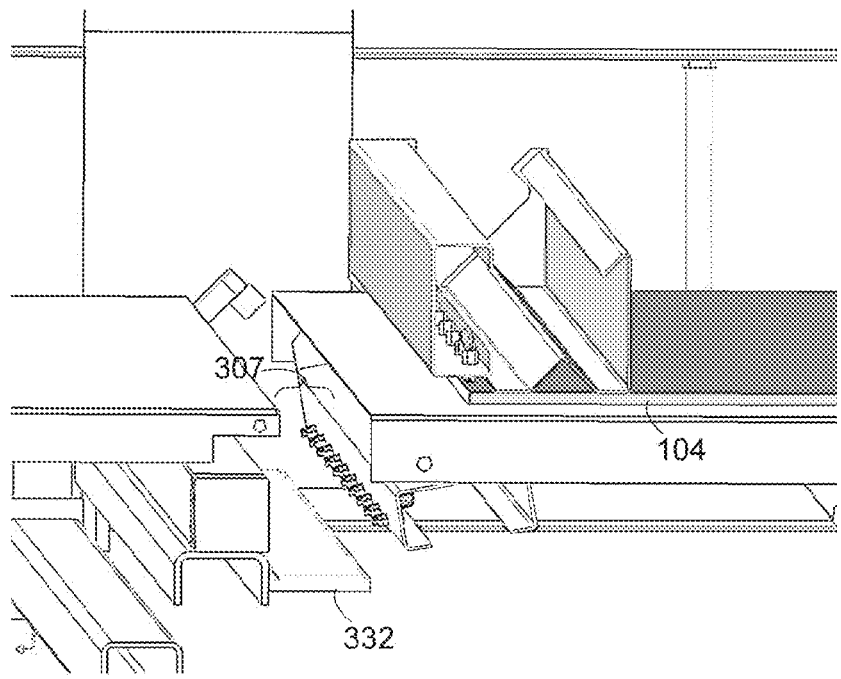
Figure 20D:
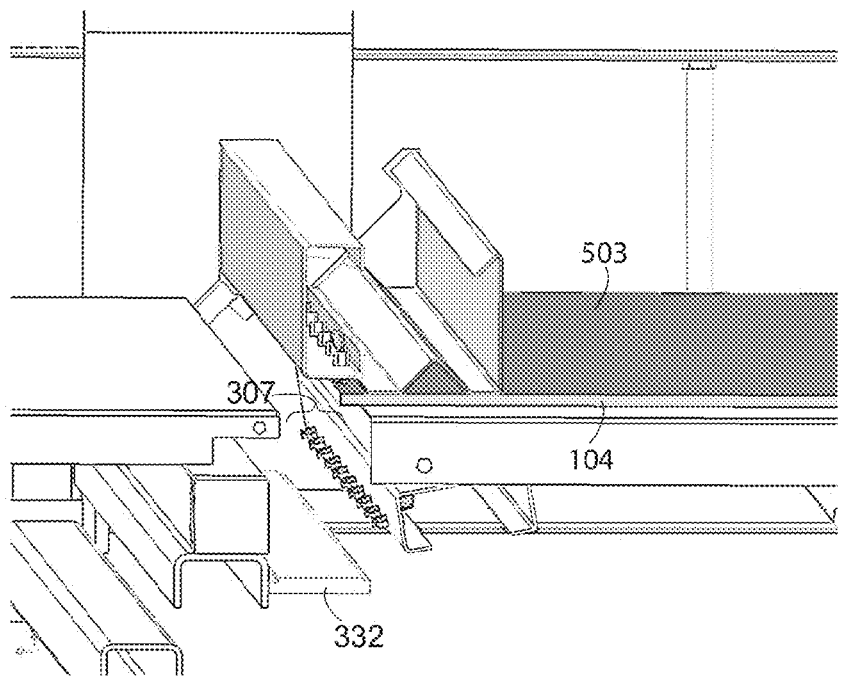
Figure 20E:
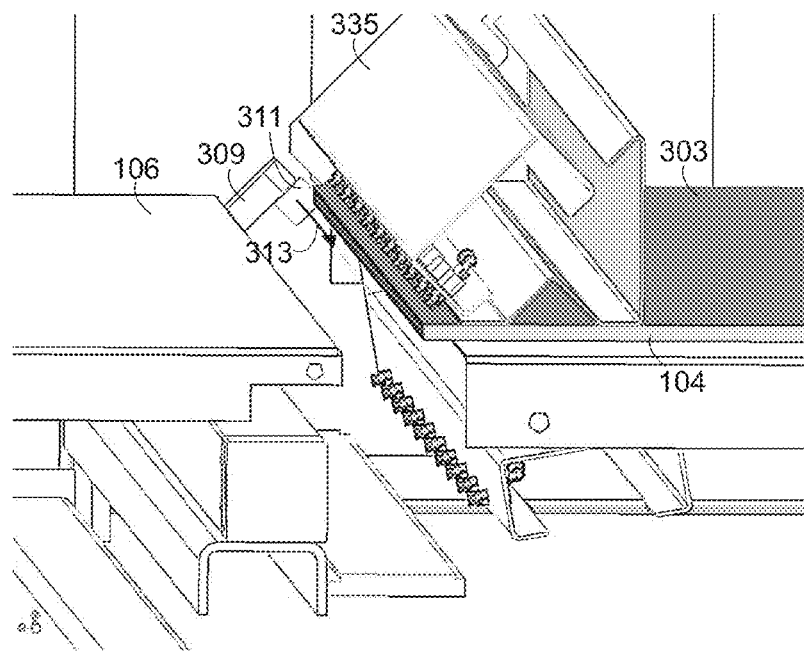
Figure 20F:
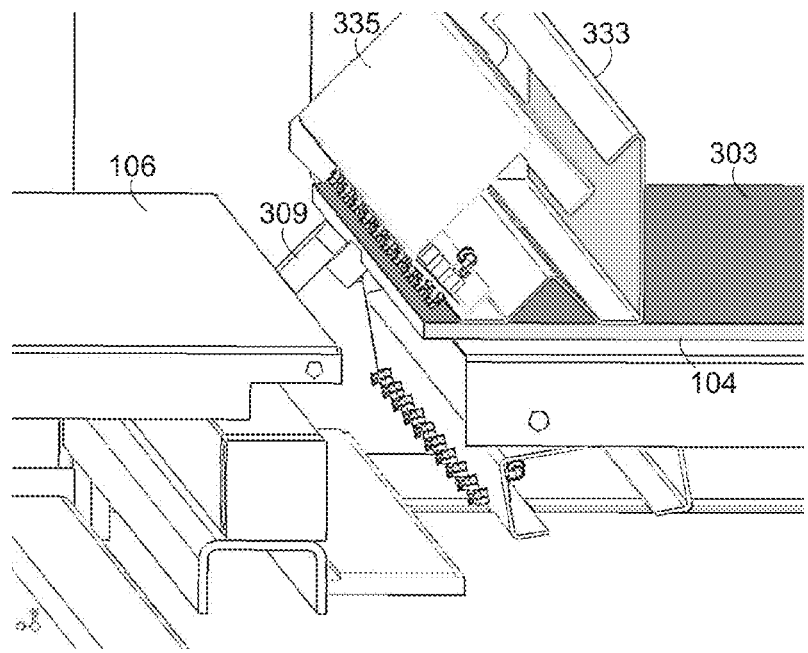
Figure 20G:
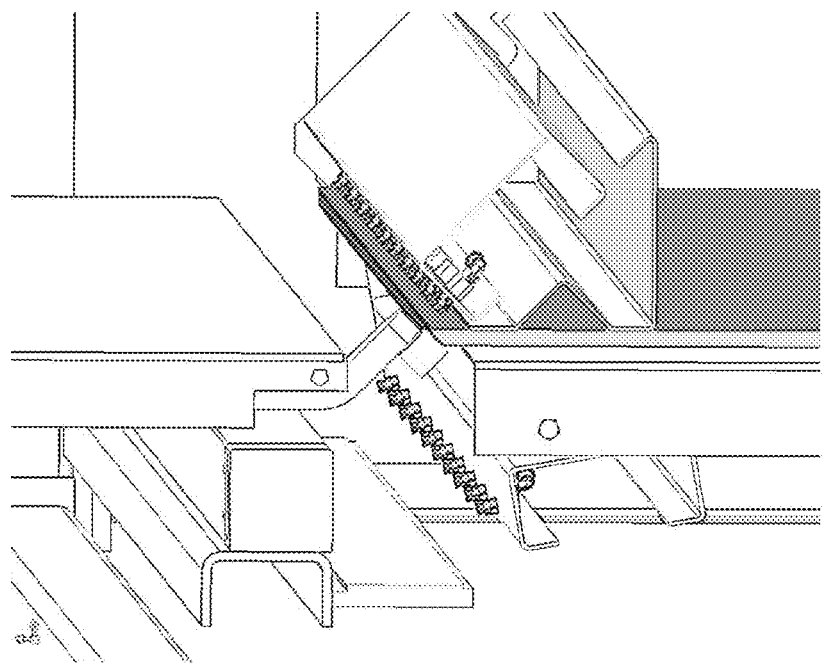
Figure 20H:
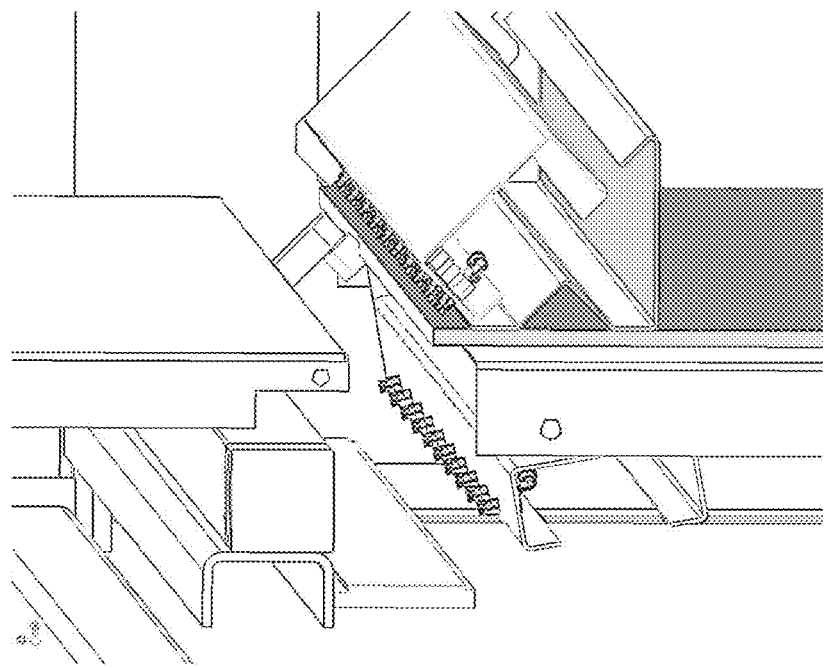
Figure 20I:
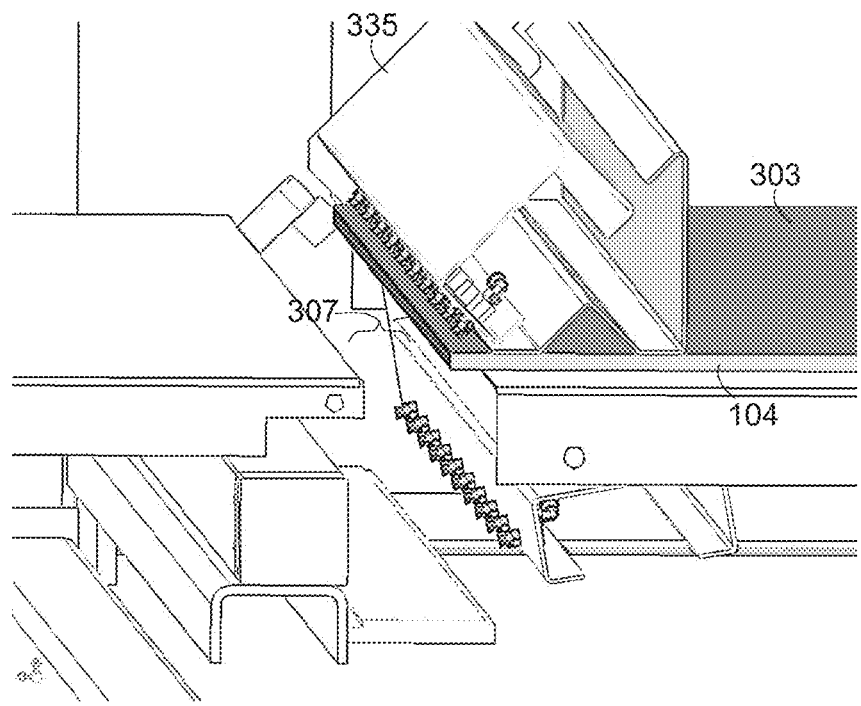
Figure 20J:
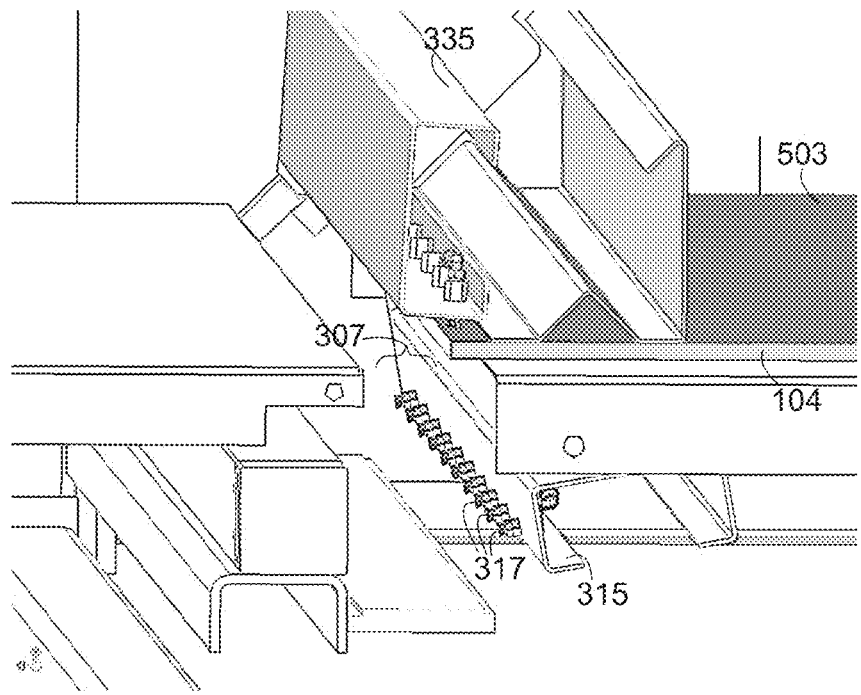
Figure 20K:
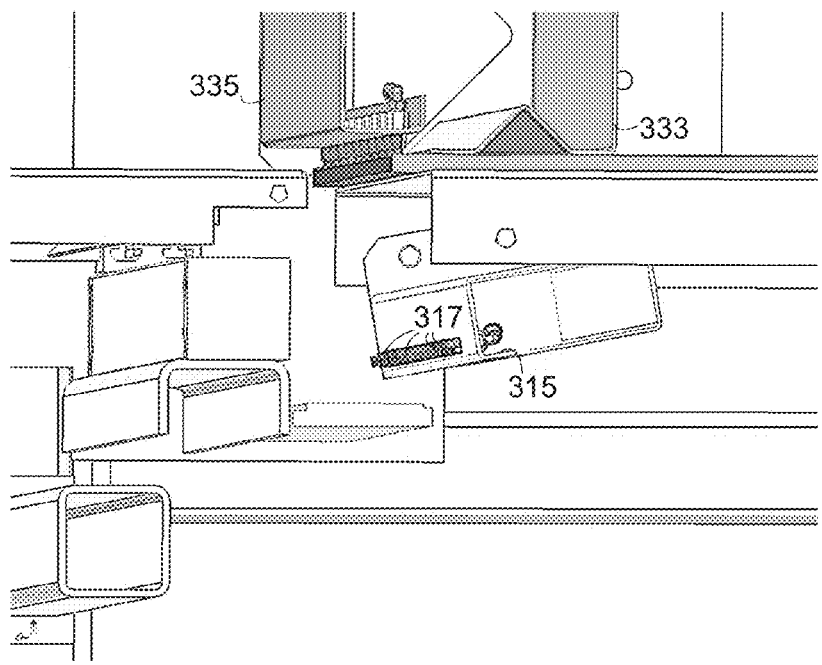
Figure 20L:
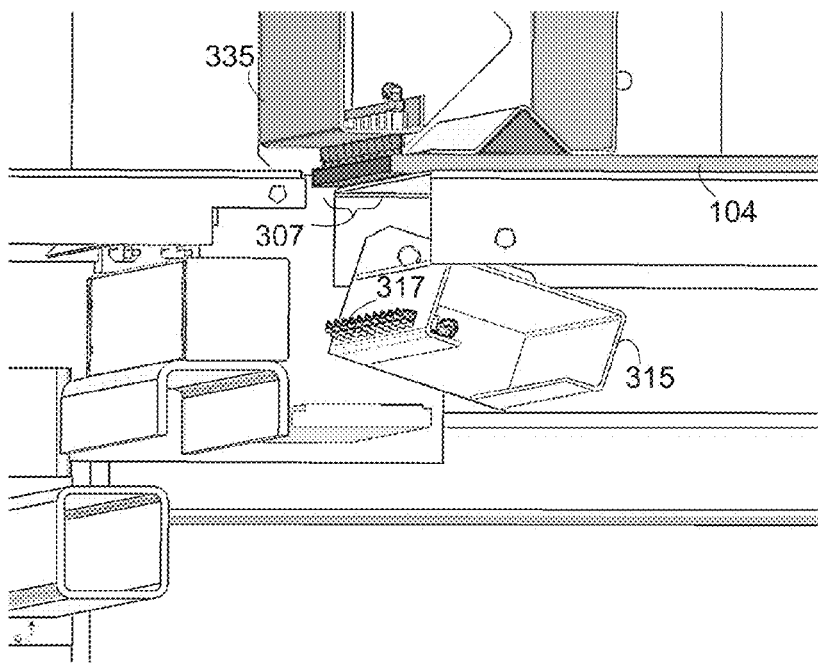
Figure 20M:
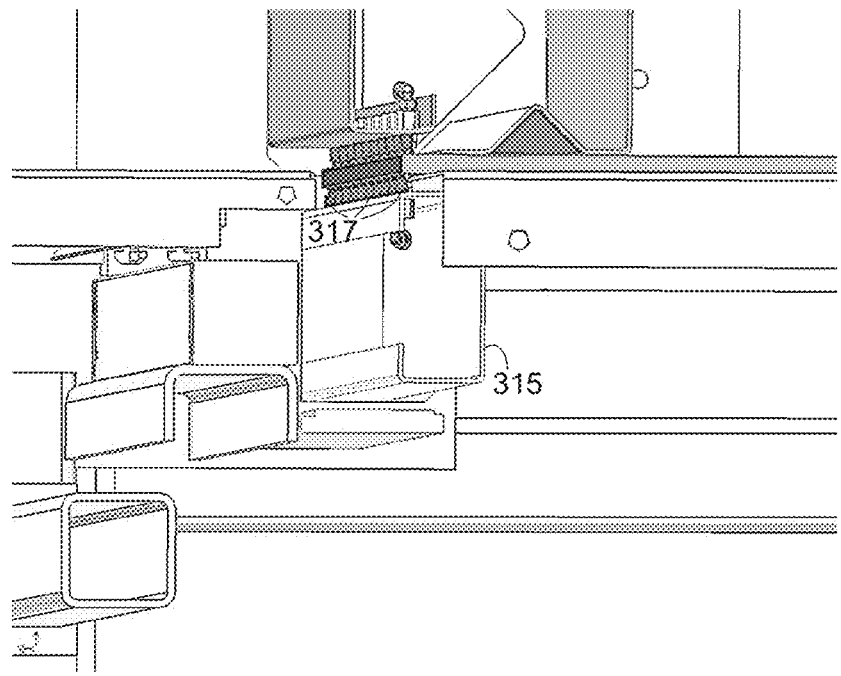
Figure 20N:
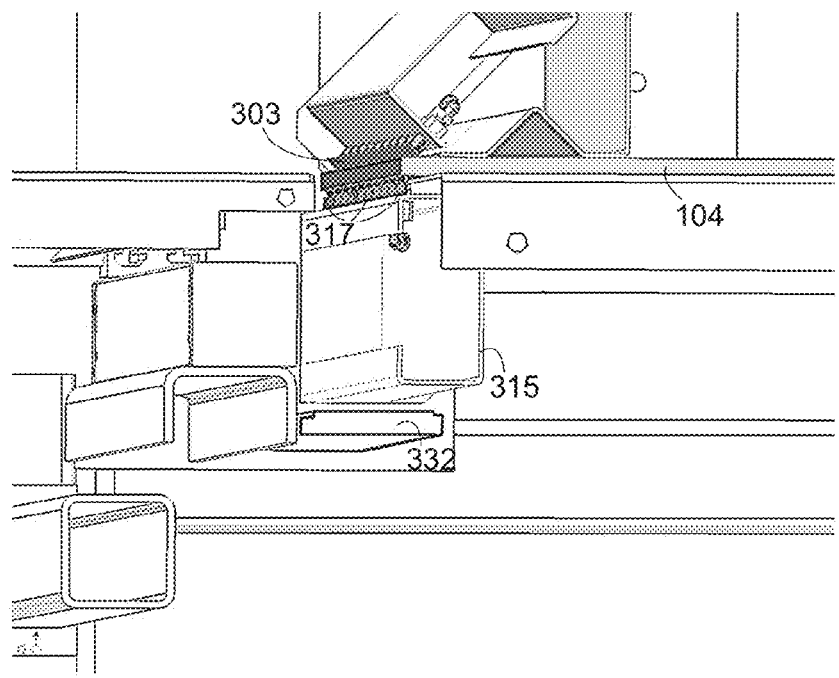
Figure 20O:
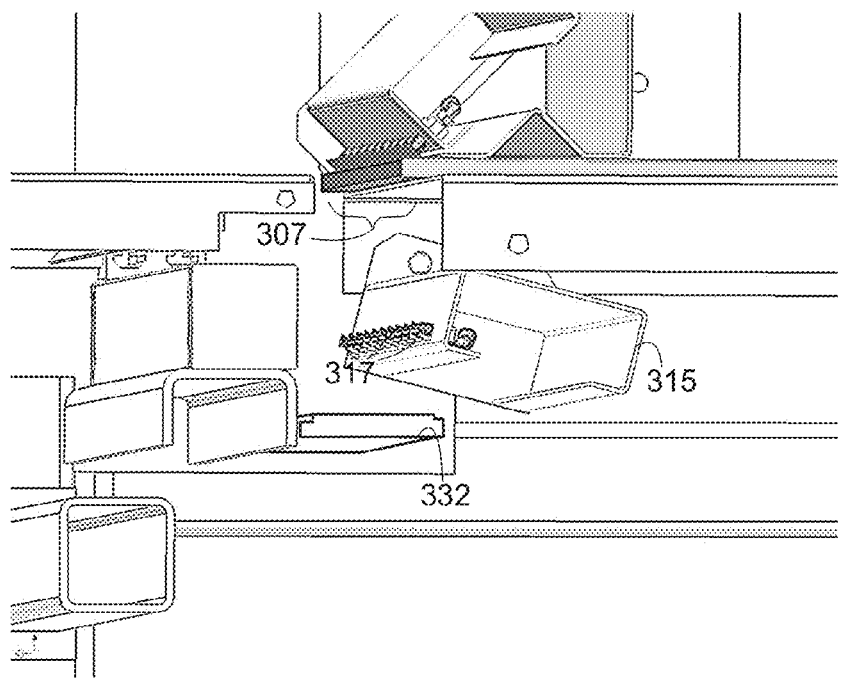
Figure 20P:
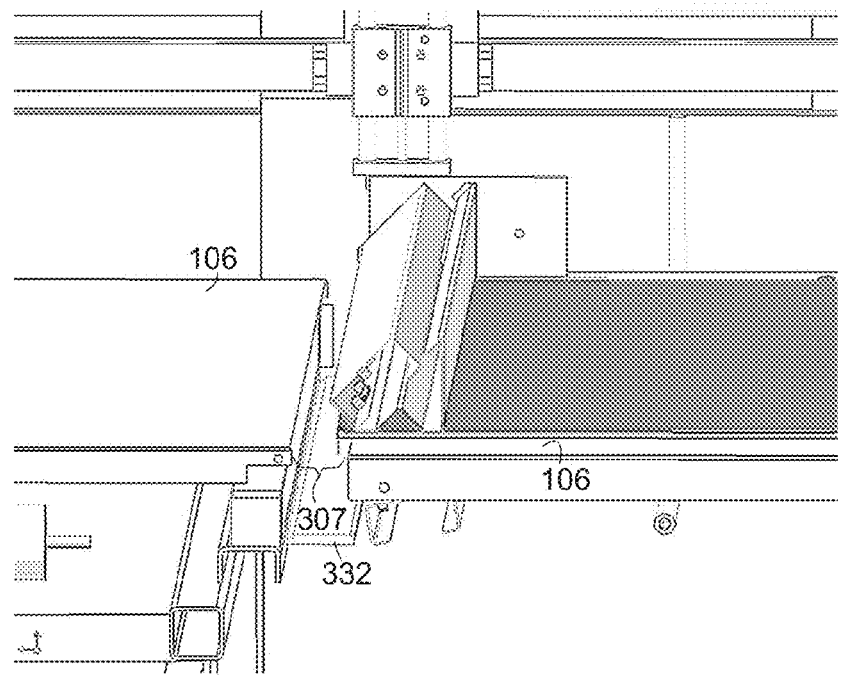
Figure 20Q:
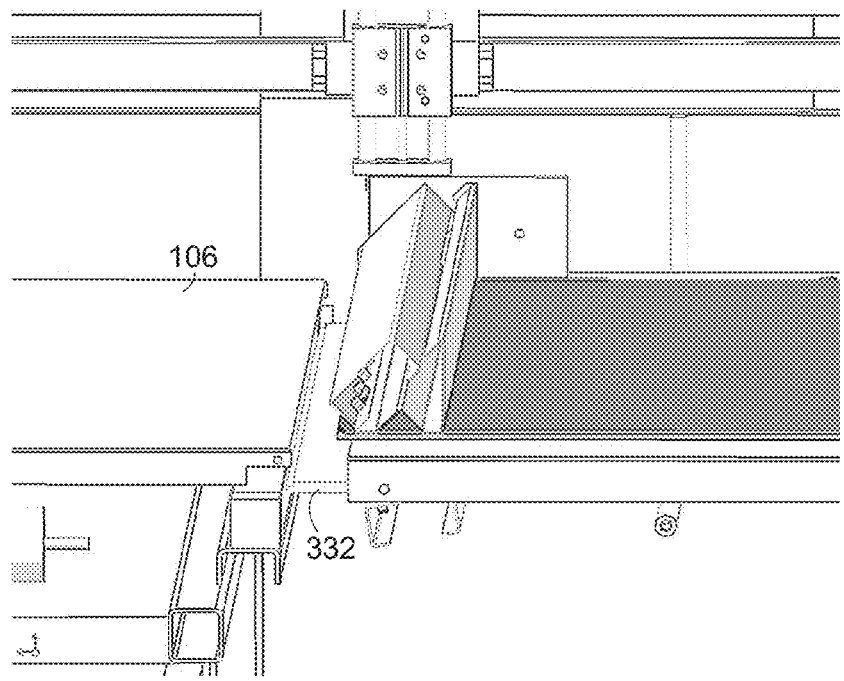
Figure 20R:
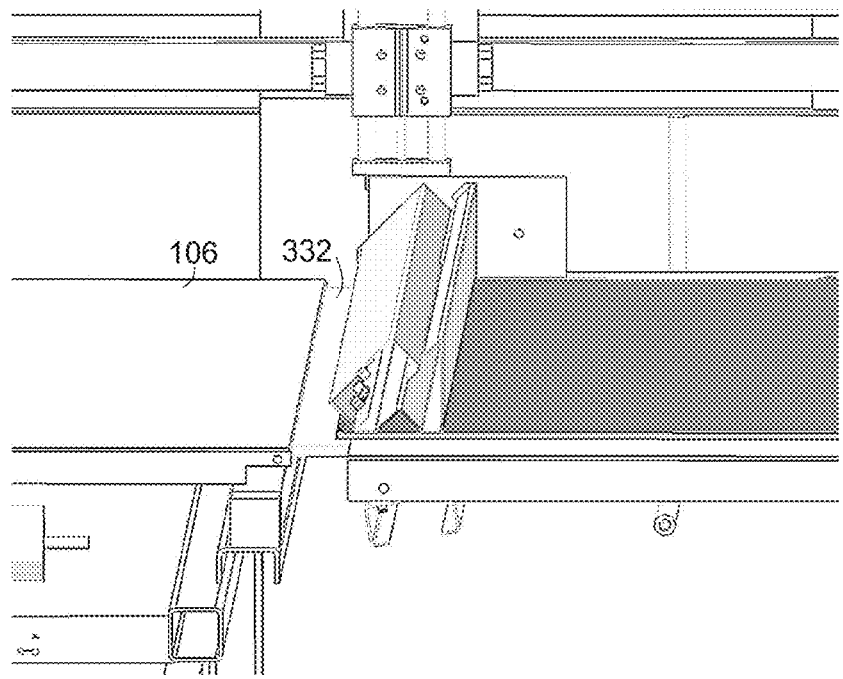
Figure 20S:
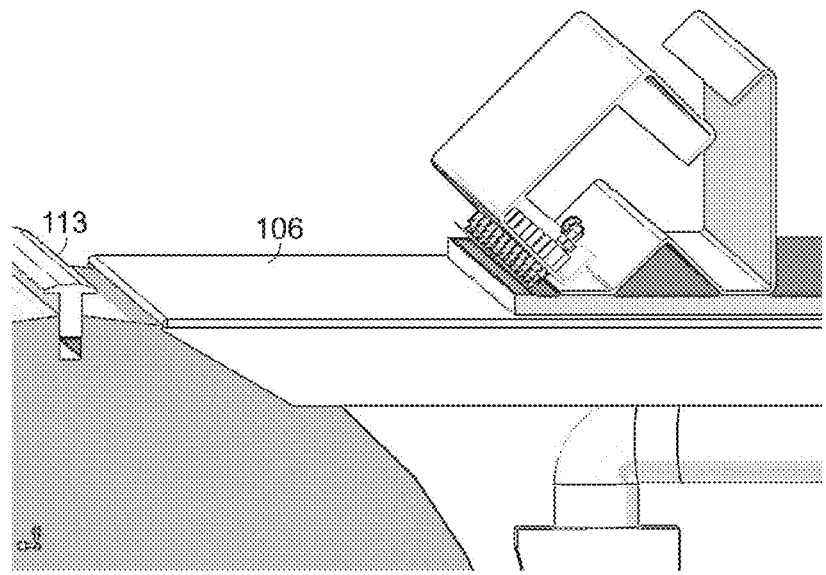
Figure 20T:
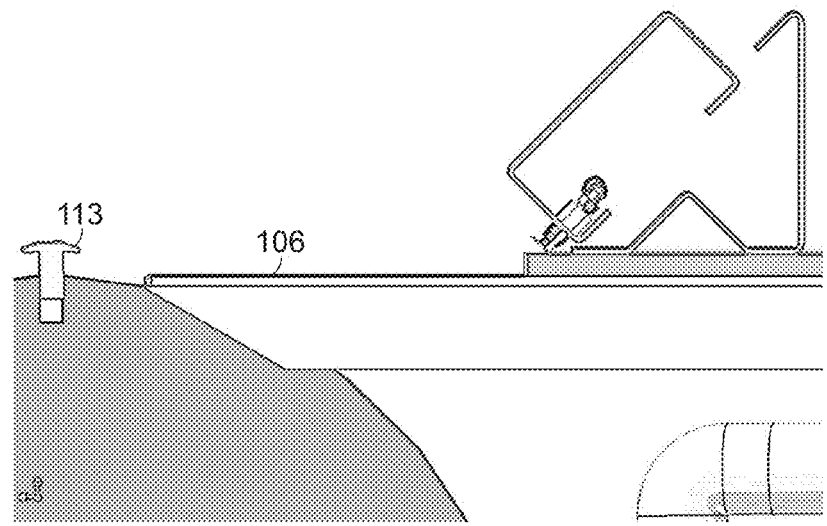
Figure 20U:
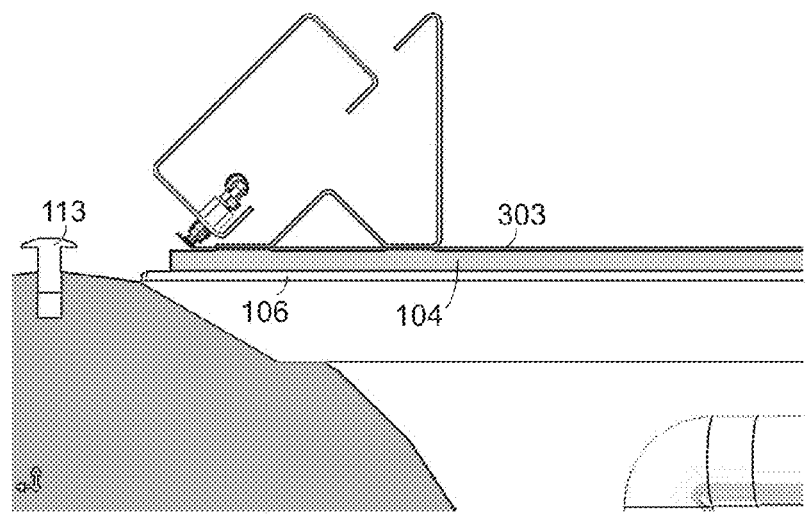
Figure 20V:
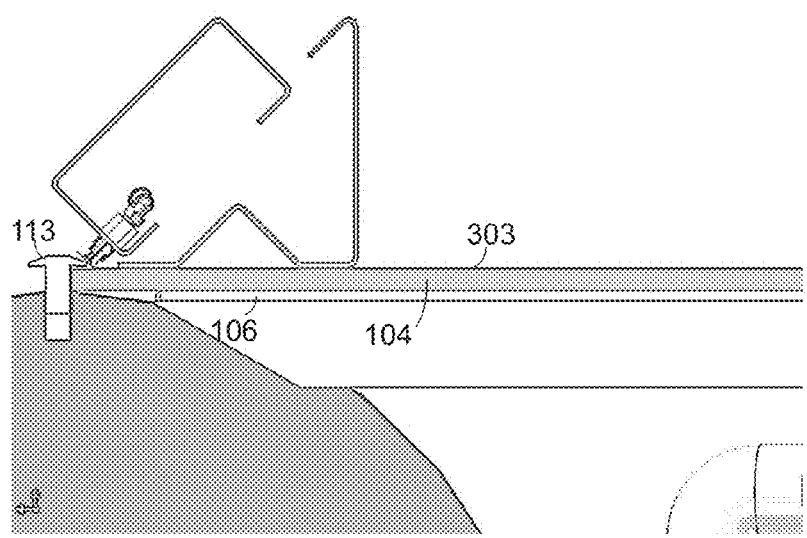
Figure 20W:
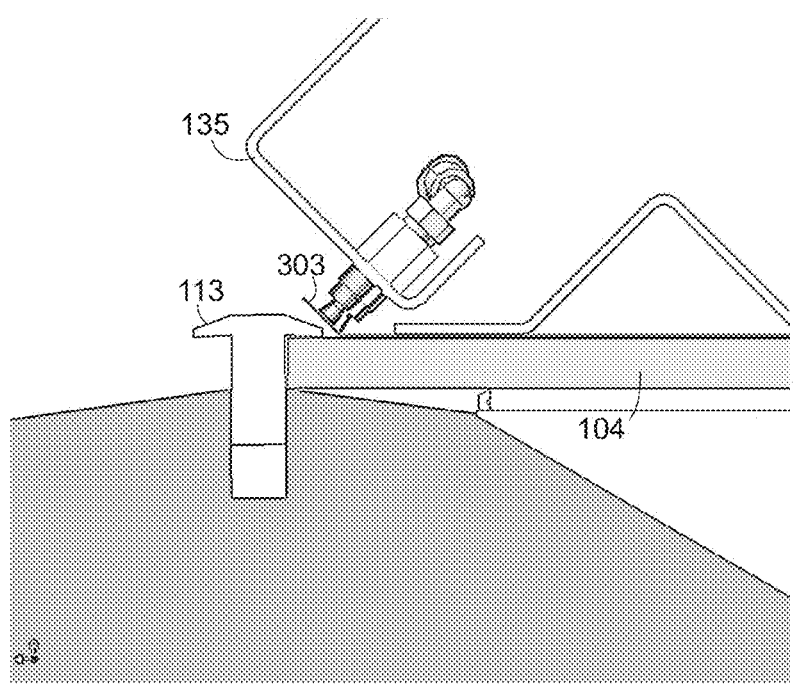
Figure 20X:
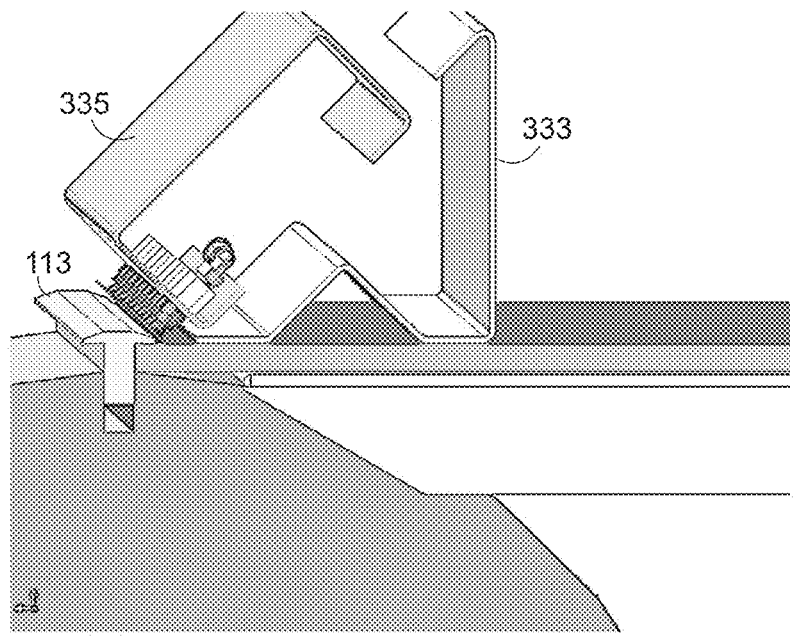
Figure 20Y:
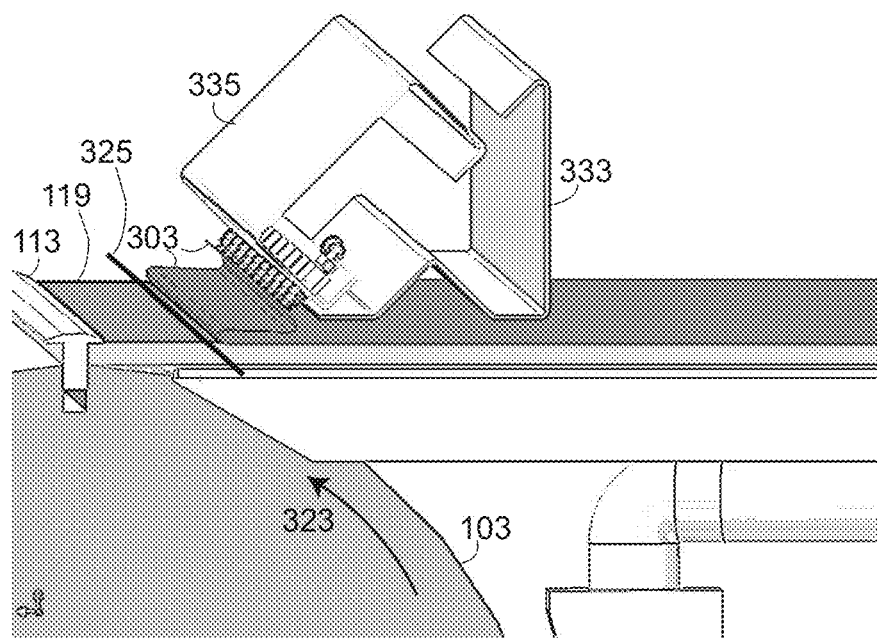

FIGS. 20A-20Y correspond to FIGS. 5A-5Y of U.S. Pat. No. 7,000,543 and show the sequence of the automatic loading onto the loading area 106, and the automatic removal of the protective sheet aspects of one embodiment the invention. These aspects are controlled under control of the control system 110.

FIG. 20A shows a first perspective view of a first mechanism 335 that includes a grabber set of suction cups gripping a plate 104 with a protective sheet 303 thereon. An adjacent section 333 maintains the combination of plate and protective sheet horizontal. The flexible pipes from the suction cups to an included source of vacuum are not shown so as not to obscure the views of how the automatic loader and protective sheet unloader operate. Only the bolts 305 of the grabber set of suction cups are shown. A movable part 332 of the loading area 106 is shown moved way to leave an opening 307 for the loading area 106.

Also shown is a bending device 309 that includes a roller 311. The bending device is movable across the width of the opening 307 back and forth in the direction shown by arrow 313.

FIG. 20B shows another perspective view that provides a better view of the bottom of the loading area 106 in the vicinity of the opening 307. This view shows a second mechanism 315 that includes another set of suction cups—the suction cups have reference numeral 317 in FIG. 20B. The suction cups are connected to a vacuum source (not shown) via pipes, one of which is shown as pipe 319. The second mechanism is hinged at hinge 320 to rotate such that the suction cups may grab the bottom of the plate when the plate is over the opening 307 of the loading area 106.

FIG. 20C shows the view of FIG. 20B while the plate is being moved horizontally out of its cassette (e.g., cassette 113 not shown) while the cassette is in its vertical loading position and its horizontal loading position.

FIG. 20D shows the plate 104 with the protective sheet and sheet away at the location such that the edge of the plate and protective sheet is above the opening 307 formed by moving away panel 332.

When the plate is at the intermediate position over the opening 307, the first mechanism 335 lets go of the plate, i.e., the vacuum is shut off, and the mechanism 335 moves away from the plate, in particular rotates such that the edge of the plate may be bent away from the plane of the surface of loading area 106. FIG. 20E shows a perceptive view with the first mechanism 335 moved such that the end edge of the plate 104 and protective sheet 303 may be so bent.

The bending device 309 that in one embodiment includes a wheel 311 that rolls against the edge of the plate now moves back and forth across the plate edge in the direction 313. This bends approximately 10 mm of the end of the plate and protective sheet to an angle that is adjustable to between 30 and 90 degrees, depending on the plate type. The adjacent section 333 maintains the adjacent part of the plate and protective sheet horizontal during the bending. The bending device moves back and forth across the plate edge between one and three times depending on the plate type. The purpose of the bending by the bending device is to loosen the protective sheet from the plate at the edge region. Otherwise, the protective sheet tends to stick heavily to the LAMS coating.

FIGS. 20F, 20G, 20H, and 20I show this back and forth action. In one alternate implementation, the suction cups of the grabber hold the plate 104 and cover 303 during bending a distance away from the edge so that the plate cannot slip in the horizontal direction.

FIG. 20J shows that at this stage, the first mechanism 335 that includes the grabber set of suction cups arranged as a row moves onto the protective sheet 303 along the width in the strip area separated from the plate. FIG. 20K shows a different perspective view that shows the second mechanism 315 that includes the other set of suction cups 317 arranged as a row. At this stage, as shown in FIGS. 20L and 20M, the second mechanism 315 moves by rotation such that the other set of suction cups is under the edge of the plate 104 through the opening 307 in the loading area 106. The order of the moving is not important, i.e., whether the top protective sheet or the bottom of plate 104 is held first, as shown in the sequence of FIGS. 20J to 20M, or in a different order. Vacuum is applied to the first and other sets of vacuum holders.

The other set of suction cups maintains the plate at the horizontal surface, while the first mechanism 335 lifts, e.g., by tilting, to tilt the protective sheet 303 at the edge away from the plate 104. FIG. 20N shows the results of such moving of the protective sheet 303 away from the plate 104.

The vacuum to the bottom other set of suction cups 317 is removed, and the second mechanism 315 of the other set of suction cups is moved away. FIG. 20O shows the suction cups 317 of the second mechanism 317 so moved away.

FIGS. 20P, 20Q and 20R show the movable panel 332 now moving to close the opening 307 to form a substantially horizontal surface. The surface of area 106 is shown closed in FIG. 20R.

The grabbing mechanism 335 with the vacuum holders still holding the protective sheet now slides the plate 104 and protective sheet 303 towards the drum 103. Such movement is shown in FIGS. 20S, 20T, 20U and 20V.

Note that in FIGS. 20S, 20T, 20U and 20V, not shown are the UV exposing elements, and the automatic removal from the drum elements. Also not shown is the front part 112 that is hinged and that is designed to bend downwards. In the embodiments shown in FIGS. 20A-20Y, the loading is assumed arranged so that the motion shown in FIGS. 20S, 20T, and 20U causes the plate to move into the gap between the (open) T-clamp and the outer surface of the drum. Those in the art will understand that this is a simplified version, and in one embodiment, the surface 106 includes the tilting front part 112 as described above. The tilting is to lower the front edge of the plate because in the embodiments described in FIGS. 1-19, the drum is positioned so that a plate can be loaded from the loading area 106, and also so that the drum can be unloaded onto the unloading area 107 underneath the loading area 106. For this, the drum in the embodiments of FIGS. 1-19 is positioned lower than in the case of the loader of U.S. Pat. No. 7,000,543, from which FIGS. 20A-20Y are derived. How to modify FIGS. 20A-20Y and the description to include the hinged part 112 and to accommodate the lower positioning of the drum for consistency with FIGS. 1-19 would be clear to those in the art.

Continuing with the loading, the plate is moved until the plate edge is under the T-clamp 113 as shown in FIG. 20V. The T-clamp 113 now closes to grip the plate 104 without also gripping the protective sheet 303 because of the sheet's being held separated from the plate 104 at the plate edge by the grabber set of suction cups. FIG. 20W shows a cross-sectional view of the clamp 113 holding the plate 104 at the plate edge. FIG. 20X shows a perspective view of this stage of operation.

Once the plate edge is clamped to the drum, two actions occur. The first action is that the first mechanism 335 moves horizontally back to its horizontal rest position close to being over the movable part 332. The grabber set of suction cups of the first mechanism 335 maintains hold onto the protective sheet 303 such that the sheet 303 is partially peeled away from the plate. The movement away from the clamp 113 is shown in FIG. 20Y.

The second motion is that the drum rotates, e.g., in the direction 323 shown in FIG. 20Y and as described herein above. The rotation of the drum with the plate clamped thereon while the grabber set of suction cups still holds onto the protective sheet further removes the protective sheet 303 from the top of the plate 104, while the plate 104 is loaded onto the drum 103.

An anti-static device 325 in the form of a wire across width of the device is turned on during the motion to emit ionized air, and in particular, ionized air that can reach the separation region between the plate and separated protective sheet and thus remove any static electricity built up, so that the removal is easier. Note that, as would be known to those in the art, the source of electric supply to the wire is not shown, nor are the mechanical supports. Note also that in an improved embodiment, one or more blowers are included to ensure that the ionized air reaches the region between the plate and separated protective sheet.

The first and second motion is coordinated. In one embodiment, the backwards movement of the gripper/first mechanism 335 occurs simultaneously with the rotation of the drum.

The protective sheet is now transported to a trash compartment.

Note that FIG. 20A-20Y do not show many details, such as the mechanical supports for the first and second mechanisms, nor the motors that cause the actions to take place under control of the control system. The particular designs are now shown so as not to obscure the operation of the devices. Those in the art will find including such mechanisms straightforward from the description provided herein.

In an alternate embodiment of the loading from a compartment as described in U.S. Pat. No. 7,000,543, the compartment once at its loading vertical position is moved to an intermediate horizontal position prior to being moved to its loading horizontal position. At the intermediate horizontal position, there is a gap between the imager and the magazine, and such gap is used to provide access to the bottom of the plate opposite the side whereon a protective sheet lays. An automatic plate mover automatically moves the plate horizontally from the compartment at the intermediate position to provide such access to the bottom of the plate. At the intermediate position, the plate is restrained on such bottom side, and while restrained, any protective sheet on the plate is partially lifted and held. The compartment and plate are now further moved horizontally to the loading horizontal position, and then the plate is further moved to an imager loading horizontal position, then onto the imager while the protective sheet is held. As the plate is loaded onto the imager, the holding of the protective sheet removes the protective sheet from the plate, such that the plate is loaded onto the imager without the protective sheet.

Not described herein are details of the control system 110. Those in the art will understand that by "under control of" and "configured to cause" mean that the control system outputs signals that cause motors and actuators to carry out the motions, and furthermore, that there are sensors that provide signals to the control system for such functionality. Those in the art also will understand that such a control system includes one or more programmable processors and a memory subsystem that includes instructions that cause the motions and actions described herein. Not shown are the motors, sensors, and actuators that work in conjunction with the control system to cause the various motions described herein, and including such motors, sensors and actuators can be carried out by those in the art given the description provided herein.

Note that in one embodiment, a T-clamp mechanism is used. Other clamping mechanisms may be used in alternate embodiments.

Note again that the method and mechanism described in U.S. Pat. No. 7,000,543 is not from a stack, and uses a different mechanism than some of the other embodiments described herein. Furthermore, not all embodiments include the bending mechanism. Those of skill in the art would be able to readily adapt the mechanism described in U.S. Pat. No. 7,000,543 to be applicable to alternate embodiments of the present invention that include loading from a stack and/or that include the bending mechanism.

In the embodiment shown in the drawings, the unloading area 107 is arranged vertically beneath the loading area 106. In alternate embodiments, the loading and unloading areas can be arranged on opposite sides of the imager or other arrangements that allow a plate to be simultaneously on the loading area and another plate to be simultaneously at the unloading area.

Note that while the description herein has been for flexographic printing plates, the invention is by no means limited to such an application and can be used for loading and/or unloading other types of printing plates to an imager. In general, the invention is applicable to making plates that include material that is curable by irradiation with ultraviolet radiation. For example, the invention is also applicable to letterpress plates with a polymer coating thereon that is cured by exposure to UV radiation.

Unless specifically stated otherwise, as apparent from the following discussions, it is appreciated that throughout the specification discussions utilizing terms such as "processing," "computing," "calculating," "determining" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All publications, patents, and patent applications cited herein are hereby incorporated by reference.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

We claim:

1. A method of operating a control system of a drum imager having rotatable drum, the method comprising:
    loading a printing plate from a loading position on a loading area on to the drum of the drum imager, the loading area adjacent to the drum, the printing plate including material that is curable by irradiation with ultraviolet radiation;
    imaging the loaded printing plate to form an imaged plate; and
    unloading the printing plate from the imager onto an unloading area separate from the loading area, the unloading area being for holding a single plate
    the method further comprising automatically irradiating the printing plate under control of the control system, the irradiating using ultraviolet radiation and controlled to occur prior to or after the imaging during one or both of loading of the plate and unloading of the plate,
    wherein while one plate is positioned at the loading position on the loading area, another plate can be unloaded from the imager or be situated at the unloading area.

2. A method as recited in claim 1, wherein the automatically irradiating is controlled to occur after the imaging.

3. A method as recited in claim 1, wherein the automatically irradiating is controlled to occur before the imaging.

4. A method as recited in claim 1, wherein the printing plate is a flexographic plate and wherein the automatically irradiating includes irradiating the underside of the flexographic plate.

5. A method as recited in claim 1, wherein the automatically irradiating includes irradiating the top side of the plate.

6. A method as recited in claim 1, wherein the printing plate is a flexographic plate and wherein the automatically irradiating includes irradiating the underside of the flexographic plate prior to the imaging and irradiating the top side of the flexographic plate after imaging.

7. A method as recited in claim 1, wherein the printing plate is a flexographic plate and wherein the automatically irradiating includes irradiating the underside of the flexographic plate and the top side of the flexographic plate after imaging.

8. A method as recited in claim 1, wherein the printing plate is a flexographic plate and wherein the automatically irradiating includes irradiating the flexographic plates during the loading of the plate to the imager.

9. A method as recited in claim 1, wherein the printing plate is a flexographic plate and wherein the automatically irradiating includes irradiating the flexographic plate during the unloading from the imager.

10. A method as recited in claim 1, wherein the printing plate is a flexographic plate and wherein automatically irradiating of the flexographic plate is integrated in a full automated or semi-automated production process.

11. A method as recited in claim 1, wherein the loading and unloading areas are arranged in a manner that enables the control system to cause a first plate to be on the loading area while another plate is simultaneously at the unloading area.

12. A method as recited in claim 11, wherein each of the loading area and unloading area are approximately horizontal.

13. A method as recited in claim 12, wherein the loading and unloading areas are arranged vertically to each other.

14. An apparatus as recited in claim 1, wherein the control means is operative to carry out the loading, imaging, and unloading in a pipeline manner that includes carrying out more than one respective operation on respective plates at the same time.

15. An apparatus for making printing plates comprising:
    means for loading a printing plate from a loading area on to a drum of a drum imager, the loading area being adjacent to the drum, the printing plate including material that is curable by irradiation with ultraviolet radiation;
    means for imaging the loaded printing plate to form an imaged plate;
    means for unloading the printing plate from the imager onto an unloading area separate from the loading area, the unloading area being for holding a single plate; and
    means for automatically irradiating the printing plate by ultraviolet radiation prior to or after the imaging during one or both of loading of the plate and unloading of the plate,
    control means to control the means for loading, the means for imaging, the means for unloading and the means for automatically irradiating, such that a plate that includes material that is curable by irradiation with ultraviolet radiation can be irradiated in an automatic manner under control of the control system during one or both of loading of the plate and unloading of the plate
    wherein while one plate is positioned at the loading position on the loading area, another plate can be unloaded from the imager by the means for unloading or be situated at the unloading area.

16. An apparatus as recited in claim 15, wherein the loading and unloading areas are arranged in a manner that enables a first plate to be on the loading area while another plate is simultaneously at the unloading area.

17. An apparatus as recited in claim 16, wherein the loading area and the unloading area are arranged one above the other, and wherein the means for automatically irradiating includes at least one ultraviolet source arranged under the loading area operable to irradiate the underside prior to imaging and at least one ultraviolet source operable to irradiate the top side after the imaging.

18. An apparatus as recited in claim 15, wherein the control means is operative to cause the means for irradiating to irradiate a plate by ultraviolet radiating automatically prior to the plate being imaged.

19. An apparatus as recited in claim 15, wherein the control means is operative to cause the means for irradiating to irradiate a plate by ultraviolet radiating automatically after the plate is imaged.

20. An apparatus as recited in claim 15,
    wherein the plate is a flexographic plate, and
    wherein the control means is operative to automatically cause ultraviolet irradiation of the underside of the flexographic plate prior to imaging, and cause ultraviolet irradiation of the top side of the plate after imaging,
    such that while the underside of a first plate is being irradiated in the loading area, a second plate can be imaged, and a third plate can be exposed on the top side in the unloading area.

* * * * *